(12) United States Patent
Nakamura et al.

(10) Patent No.: US 7,485,361 B2
(45) Date of Patent: Feb. 3, 2009

(54) MULTILAYERED PRINTED WIRING BOARD AND MANUFACTURING METHOD THEREOF

(75) Inventors: Kensuke Nakamura, Ageo (JP); Tetsuro Sato, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 99 days.

(21) Appl. No.: 10/580,198

(22) PCT Filed: Dec. 9, 2004

(86) PCT No.: PCT/JP2004/018355

§ 371 (c)(1),
(2), (4) Date: May 23, 2006

(87) PCT Pub. No.: WO2005/060324

PCT Pub. Date: Jun. 30, 2005

(65) Prior Publication Data

US 2007/0102804 A1    May 10, 2007

(30) Foreign Application Priority Data

Dec. 16, 2003    (JP)    ............................. 2003-418376

(51) Int. Cl.
*B32B 9/00* (2006.01)
(52) U.S. Cl. ........................ 428/209; 428/624; 428/626; 428/646; 174/259; 361/751
(58) Field of Classification Search .................. 428/209, 428/624, 626, 646; 174/250, 255, 259; 361/751
See application file for complete search history.

(56) References Cited

U.S. PATENT DOCUMENTS 6,187,416 B1 *    2/2001    Satoh et al. .................. 428/209

(Continued)

FOREIGN PATENT DOCUMENTS

JP    58-118241 A    7/1983

(Continued)

*Primary Examiner*—Cathy Lam
(74) *Attorney, Agent, or Firm*—Rothwell, Figg, Ernst & Manbeck, P.C.

(57) ABSTRACT

An object of the present invention is to provide a multi-layered printed wiring board which does not require roughening such as black oxide treatment and the like on inner layer circuits. For the purpose of achieving this object, there is adopted a multi-layered printed wiring board characterized by comprising a primer resin layer P comprising exclusively a resin between each inner layer circuit Ci formed without roughening and an insulating resin layer 5 of the multi-layered printed wiring board. The multi-layered printed wiring board is manufactured by taking the steps such as (a) a steps for producing a primer resin sheet with a carrier film including a 2 micron m to 12 micron m thick primer resin layer; (b) a steps for placing the primer resin sheet on the inner-layer circuit board in which the primer resin layer of the primer resin sheet with a carrier film is placed on the inner layer circuit board and then the carrier film is removed; (c) a steps for pressing in which a pre-preg and a metal foil for forming a conductive layer are superposed on the primer resin sheet, and pressed to form the multi-layered metal clad laminate; and (d) a steps for forming an outer layer circuit wherein the outer layer circuit is formed by etching the outer layer metal foil of the multi-layered metal clad laminate to make the multi-layered printed wiring board.

7 Claims, 22 Drawing Sheets

U.S. PATENT DOCUMENTS

| | | | |
|---|---|---|---|
| 6,652,962 B1 * | 11/2003 | Sato et al. | 428/352 |
| 6,716,530 B2 * | 4/2004 | Sato et al. | 428/416 |
| 6,831,129 B2 * | 12/2004 | Sato et al. | 525/58 |
| 6,905,757 B2 * | 6/2005 | Matsushima et al. | 428/209 |

FOREIGN PATENT DOCUMENTS

| | | | |
|---|---|---|---|
| JP | 2-303187 A | 12/1990 |
| JP | 2001-284821 A | 10/2001 |
| JP | 2002-314243 A | 10/2002 |
| JP | 2003-127313 A | 5/2003 |
| JP | 2003-249739 A | 9/2003 |

* cited by examiner (A)

(B)

(5)

(6)

(7)

(a)

(b)

(5)

(6)

(7)

(a)

(b)

(5)

(6)

(7)

(a)

(b)

(1)

(2)

(3)

(1)

(2)

(3)

(1)

(2)

(3)

(1)

(2)

(3)

(1)

(2)

(3)

(4)

(5)

(6)

MULTILAYERED PRINTED WIRING BOARD AND MANUFACTURING METHOD THEREOF

CROSS REFERENCE TO RELATED APPLICATION

This application is a 35 USC § 371 National Phase Entry Application from PCT/JP2004/018355, filed Dec. 9, 2004, and designating the United States.

TECHNICAL FIELD

The present invention relates to a multi-layered printed wiring board which has enough bond strength within an insulating layer and an inner layer circuit without any roughening treatment, and manufacturing method of the multi-layered printed wiring board.

BACKGROUND ART

To ensure adhesion within an insulating layer and an inner layer circuits in conventional multi-layered printed wiring boards (hereinafter referred to as "MLB"), fine copper oxide particles (a so-called "black oxide treatment", and hereinafter referred to as "a B/O treatment") have been made on it as disclosed in Patent Document 1. The reason for requirement on such a B/O treatment is to prevent a de-lamination between the shiny side of a copper foil constituting the inner layer circuit and the inner layer insulating material when a MLB undergoes thermal shock in a solder re-flow process or the like.

However, such a conventional B/O treatment is made of copper oxide particles, and so such portions can be etched more rapidly than portions of copper metal. Consequently, etching after such a B/O treatment results removal of the B/O treatment on the circuit edge. In such a way, so called "haloing" are caused in the fringe of the inner layer circuit patterns; thus, when a PWB with such an inner layer circuit, the peripheries of the land portions shows pink colored rings through substrate, which has been sometimes referred to as "pink rings."

So, a process for solving the problems in such a traditional B/O treatment has come to be generally used. In which, copper oxide is once formed on the surface of the inner layer circuit, and then the copper oxide is subjected to a reduction treatment to convert the surface to be a copper metal as referred in Patent Documents 2 to 4. This method can prevent the generation of the above described haloing phenomena.

Patent Document 1: Japanese Patent Laid-Open No. 64-37081
Patent Document 2: Japanese Patent Laid-Open No. 3-87092
Patent Document 3: Japanese Patent Laid-Open No. 4-217391
Patent Document 4: Japanese Patent Laid-Open No. 5-152740

DISCLOSURE OF THE INVENTION

Problems to be Solved by the Invention

However, the physical shape of such asperities formed as a result of the B/O treatment and the reduced B/O treatment on the surface of the circuit causes some drawbacks. When the clock frequencies of a CPU reach G-Hz levels, circuits for computers have been required excellent performances in high frequency applications. As the frequency of a signal tends to be a high frequency region, the current tends to flow on the skin layer of the circuit. So, with increasing signal frequency, the signal current comes to flow near the B/O-treated layer or the reduced B/O treated layer. Thus poor high frequency properties such as inter-layer cross-talk property make it hard to produce a thin PWB. In addition, applying just B/O treatment may decrease 2 micron m to 3 micron m thick metal on the surface portion of the circuit. And it leads to narrower the circuit width which leads to no-uniformity in the circuit widths. And it may also reduce the cross sectional areas of the circuit leading to increase the electric resistance of the circuit.

An example of a step for manufacturing a conventional MLB 1' is described in FIGS. 22 and 23. At the beginning, a double-sided copper clad laminate (hereinafter referred to as "CCL") as shown in FIG. 22(1) is prepared. In this case, the double-sided CCL has two copper foils 6 which are laminated on both side of a pre-preg 5. The surface of each copper surface 6 is subjected to a B/O treatment to form fine copper oxide particles as shown in FIG. 22 (2). Thereafter, an etching resist layer is formed on each surface 20. And then circuit patterns are exposed and developed, and etching is carried out to form inner layer circuits Ci, as shown in FIG. 22 (3).

Then, as shown in FIG. 23(4), a pre-preg and a copper foil are placed on each side of the inner layer circuits Ci. And it is hot pressed to be bonded together as shown in FIG. 23(5), a multi-layered copper clad laminate as shown in FIG. 23 (6) is produced. Then, the outer layer copper foils of the multi-layered copper clad laminate are subjected to processing for forming outer layer circuits to be a MLB.

Generally, for the B/O treatment in the steps shown in FIG. 22(2), a wet chemical process using potassium per sulfate bath, sodium chlorite bath or the like is adopted. And proper management of any of these bathes is a very difficult. These bathes are usually very sensitive, for example, as light change of the chlorine concentration cause a drastic variation of the performance in B/O treatment on a product obtained. Thus, in order to obtain a consistency, big management effort is required. So, if the B/O treatment process could be eliminated, PWB manufacturers can reduce the production term, and moreover, they can reduce the total production cost drastically.

As shown above, if MLB could be manufactured without B/O treatment, the PWB industry, facing to international price competition, can improve both the production efficiency and the total production cost drastically, to gain immeasurable profits.

Means for Solving the Problems

As shown-above, the present inventors have investigated on a production process of a MLB in which a B/O treatment has eliminated by using the layer structure of the MLB of the present invention. Then "a MLB" and "a method for manufacturing a MLB" will be described below separately.

(The MLB of the Present Invention)

Technical concept of the MLB of the present invention is characterized in that the MLB has a primer resin layer constituted just a resin, between the inner layer circuit without B/O treatment and an insulating resin layer.

A surface layer of the inner layer circuit is preferred to be plated with tin, nickel or an alloy of these metals.

A silane coupling agent layer is preferred to be provided between the inner layer circuit and the primer resin layer.

The silane coupling agent layer is preferred to be formed by an amino-silane coupling agent or a mercapto-silane coupling agent.

Further, the primer resin layer is preferred to have a cross sectional thickness from 1 micron m to 10 micron m.

The primer resin layer formed in the MLB of the present invention is preferred to be a resin mixture including 20 to 80 parts by weight of an epoxy resin, 20 to 80 parts by weight of a solvent-soluble aromatic polyamide resin polymer and a curing accelerator added in an appropriate amount according to need.

The aromatic polyamide resin polymer used for the primer resin layer is preferred to be a reaction product between an aromatic polyamide and a rubbery resin.

The primer resin layer formed is also preferred to be a resin mixture including 20 to 50 parts by weight of an epoxy resin (inclusive of a curing agent), 50 to 95 parts by weight of a poly-ethersulfone resin (having a hydroxy functional or an amino functional at a terminal thereof, and soluble in a solvent), and a curing accelerator added in an appropriate amount according to need.

(A Method for Manufacturing the MLB of the Present Invention)

A first method for manufacturing the MLB of the present invention is preferred to adopt a manufacturing method including the steps of:

(a) producing of a primer resin sheet with a carrier film by coating a primer resin composition in 2 micron m to 12 micron m thick on the surface of the carrier film and semi-cure the resin composition coated;

(b) bonding of primer resin sheet by superposing the surface of the primer resin sheet with a carrier film against the inner layer circuit board to place the primer resin sheet on the inner layer circuit board, and then release the carrier film;

(c) processing to form a multi-layered metal clad laminate in which primer resin layer lies along the surface shape of the inner layer circuit board by superposing a pre-preg and a metal foil on the primer resin sheet and hot-press; and (d) etching of the outer layer metal foil of the multi-layered metal clad laminate to finish the multi-layered printed wiring board.

A second method for manufacturing the MLB of the present invention is preferred to adopt a manufacturing method characterized by including the steps of:

(a) coating of a primer resin for forming a 2 micron m to 12 micron m thick in a B-stage by coating a resin composition onto the inner layer circuit board;

(b) processing for forming a multi-layered metal clad laminate by superposing a pre-preg and a metal foil on the primer resin layer, and hot-press to get multi-layered printed wiring board with primer resin layer which lies along the surface shape of the inner layer board; and (c) etching of the outer layer metal foil of the multi-layered metal clad laminate to finish the multi-layered printed wiring board.

A third method for manufacturing the MLB of the present invention is preferred to adopt a manufacturing method characterized by including the steps of:

(a) producing of a primer resin sheet with a carrier film by coating a primer resin composition in 2 micron m to 12 micron m thick on the surface of the carrier film and semi-cure the resin composition coated;

(b) bonding of primer resin sheet by superposing the surface of the primer resin sheet with a carrier film against the inner layer circuit board to place the primer resin sheet on the inner layer circuit board, and then release the carrier film;

(c) processing for forming a multi-layered metal clad laminate in which primer resin layer lies along the surface shape of the inner layer board by superposing a resin coated metal foil on the primer resin sheet and hot-press; and (d) etching of the outer layer metal foil of the multi-layered metal clad laminate to finish the multi-layered printed wiring board.

A fourth method for manufacturing the MLB of the present invention is preferred to adopt a manufacturing method characterized by including the steps of:

(a) coating of a primer resin for forming a 2 micron m to 12 micron m thick primer resin layer in a B-stage by coating a resin composition onto the inner layer circuit board;

(b) pressing for forming a multi-layered metal clad laminate in which primer resin layer lies along the surface shape of the inner layer board by superposing a resin coated metal foil on the primer resin layer and hot-press; and (c) etching of the outer layer metal foil of the multi-layered metal clad laminate to finish the multi-layered printed wiring board.

A fifth method for manufacturing the MLB of the present invention is preferred to adopt a manufacturing method characterized by including the steps of:

(a) producing of a primer resin sheet with a carrier film by coating a resin composition as a 2 micron m to 12 micron m thick on the surface of the carrier film and semi-cure the resin composition coat;

(b) bonding of primer resin sheet by superposing the surface of the primer resin sheet with a carrier film against the inner layer circuit board to place the primer resin sheet on the inner layer circuit board, and then release the carrier film;

(c) processing for forming a multi-layered metal clad laminate in which primer resin layer lies along the surface shape of the inner layer board by superposing a skeletal material reinforced resin coated metal foil on the primer resin layer and hot-press; and (d) etching of the outer layer metal foil of the multi-layered metal clad laminate to finish the multi-layered printed wiring board.

A sixth method for manufacturing the MLB of the present invention is preferred to adopt a manufacturing method characterized by including the steps of:

(a) coating of a primer resin for forming a 2 micron m to 12 micron m thick primer resin layer in a B-stage by coating a resin composition onto the inner layer circuit board;

(b) processing for forming a multi-layered metal clad laminate in which primer resin layer lies along the surface shape of the inner layer board by superposing a skeletal material reinforced resin coated metal foil on the primer resin layer and hot-press; and (c) etching of the outer layer metal foil of the multi-layered metal clad laminate to finish the multi-layered printed wiring board.

The resin coated metal foil with a skeletal material to be used in the above described manufacturing methods is preferred to be a product manufactured by the steps of:

(a) forming a varnish layer with predetermined thickness on the surface of a metal foil;

(b) drying the varnish layer on the surface of the metal foil;

(c) bonding a skeletal material onto the surface of the dried resin layer coated on the metal foil by superposing the skeletal material thereon and preheat to bond the skeletal material thereon;

(d) impregnating the thermosetting resin into said skeletal material mounted on the surface of the resin coated metal foil by heating up at a temperature at which the resin becomes again fluidizable; and (e) cooling the resin impregnated skeletal material after completion of the resin impregnation to prevent full curing and to keep the thermosetting resin impregnated into the skeletal material in a B-stage.

The resin composition to be used for forming the primer resin film is preferred to be prepared by the following steps (a) and (b):

(a) preparing a resin mixture by mixing 20 to 80 parts by weight of an epoxy resin, 20 to 80 parts by weight of a solvent-soluble aromatic polyamide resin polymer and a curing accelerator added in an appropriate amount according to need; and (b) preparing a varnish with a resin composition having 25 wt % to 40 wt % of a solid resin content by dissolving the resin mixture in an organic solvent.

Another resin composition used for forming the primer resin layer by coating on inner layer circuit is preferred to be prepared in the following steps (a) and (b):

(a) preparing a resin mixture by mixing 20 to 80 parts by weight of an epoxy resin, 20 to 80 parts by weight of a solvent-soluble aromatic polyamide resin polymer and a curing accelerator added in an appropriate amount according to need; and (b) preparing a varnish with resin composition having 8 wt % to 15 wt % of a solid resin content by dissolving the resin mixture in an organic solvent.

Effect of the Invention

The MLB of the present invention can show an enough adhesion of the insulating resin with the inner layer circuit layer without any particular roughening treatment. So, the roughening treatment such as a B/O treatment which has been applied to improve the adhesion between the inner layer circuit surface and the insulating resin layer can be eliminated.

DESCRIPTION OF THE REFERENCE NUMERALS AND CHARACTERS

Figure 1:
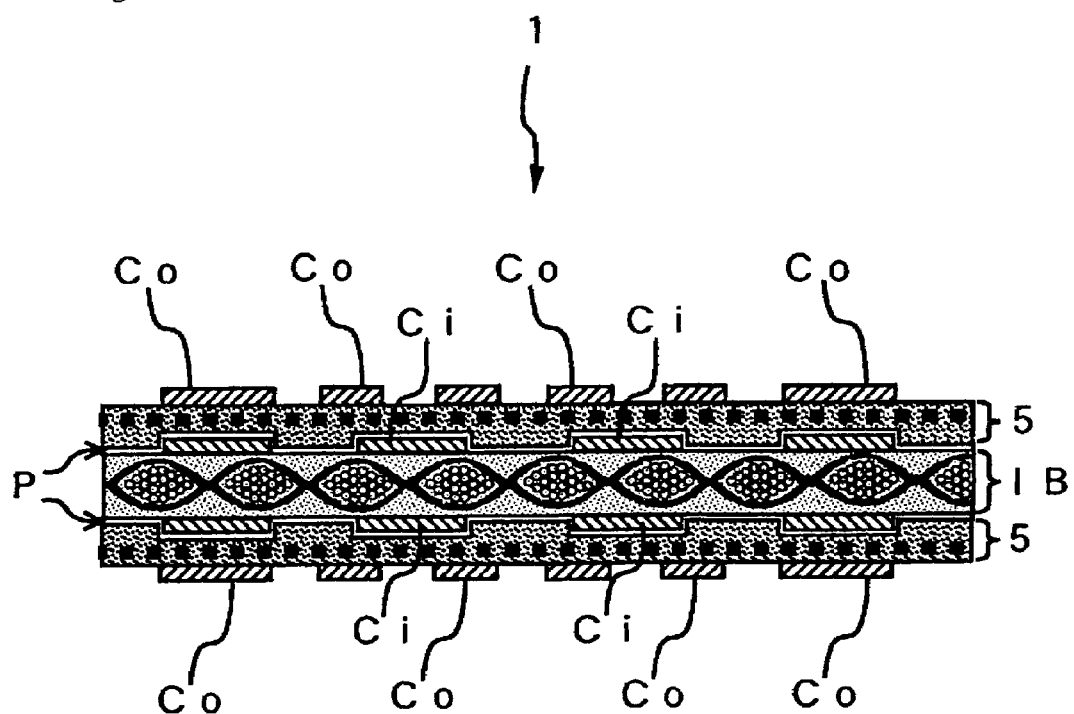
FIG. 1 is a schematic sectional view it shows an example of a MLB of the present invention.

1 Multi-layered printed wiring board
2 Primer resin sheet with a carrier film
3 Primer resin sheet
4 Skeletal material
5 Pre-preg (insulating resin layer)
6 Metal foil (Copper foil)
7 Resin coated metal (copper) foil
8 Resin layer (without skeletal material in the resin coated metal (copper)
9 Skeletal material reinforced resin coated metal (copper) foil
10 Resin layer (with skeletal material in the resin coated metal foil)
11 Roughened surface
12 First thermosetting resin layer
14 Second thermosetting resin layer
15 Thermosetting resin layer
16 Straight line circuit (for use in peel strength measurement)
17 Resin coated metal (copper) foil for test
P Primer resin layer (inclusive of a B-stage)
F Supporting film
IB Inner layer circuit board
Ci Inner layer circuit
Co Outer layer circuit
M1, M2, M3 Multi-layered metal (copper) clad laminate
R Resin composition (varnish)

BEST MODE FOR CARRYING OUT THE INVENTION

Embodiments and examples related to "a MLB" and "a method for manufacturing a MLB" of the present invention will be described below.

<Construction of the MLB>

The MLB 1 of the present invention has a construction shown as schematic sectional view in FIG. 1. In the market, a four-layer board is sometimes referred to as a shielded board for the purpose of discriminating it from a MLB. But in the present invention, a MLB includes a board having at least one inner layer circuit Ci and at least one outer layer circuit Co, irrespective with the number of the conductive layers involved therein.

First, the MLB of the present invention is characterized by comprising "a primer resin layer, constituted just a resin, between inner layer circuit without roughening treatment and an insulating resin layer". In the MLB 1, the primer resin layer P is disposed at least between the inner layer circuit Ci and the insulating resin layer 5. So, the primer resin layers P cover the surface of an inner layer board IB as shown in FIG. 1.

Additionally, the surface of the inner layer circuit Ci has no roughening treatment such as the B/O treatment or any particles made of foreign metals. For the purpose of forming this inner layer circuit Ci, any type of metal foil, such as electro-deposited copper foil or rolled copper foil with any thickness can be used. Moreover, in the case of electro-deposited copper foil, both of a shiny side and matte side can be used.

The surface roughness (Rz) of the inner layer circuit Ci is preferably up to 2 micron m when the roughening treatment is not applied. This is because when the surface roughness (Rz) is 2 micron m or less, the radiation points of high-frequency signals may be less, so the inter-layer cross-talk properties is sharply improved. In the present invention, the shiny side (Rz may be up to 1.8 micron m) can acquire acceptable bond strength to the insulating resin layer owing to the presence of the primer resin layer.

Figure 2:
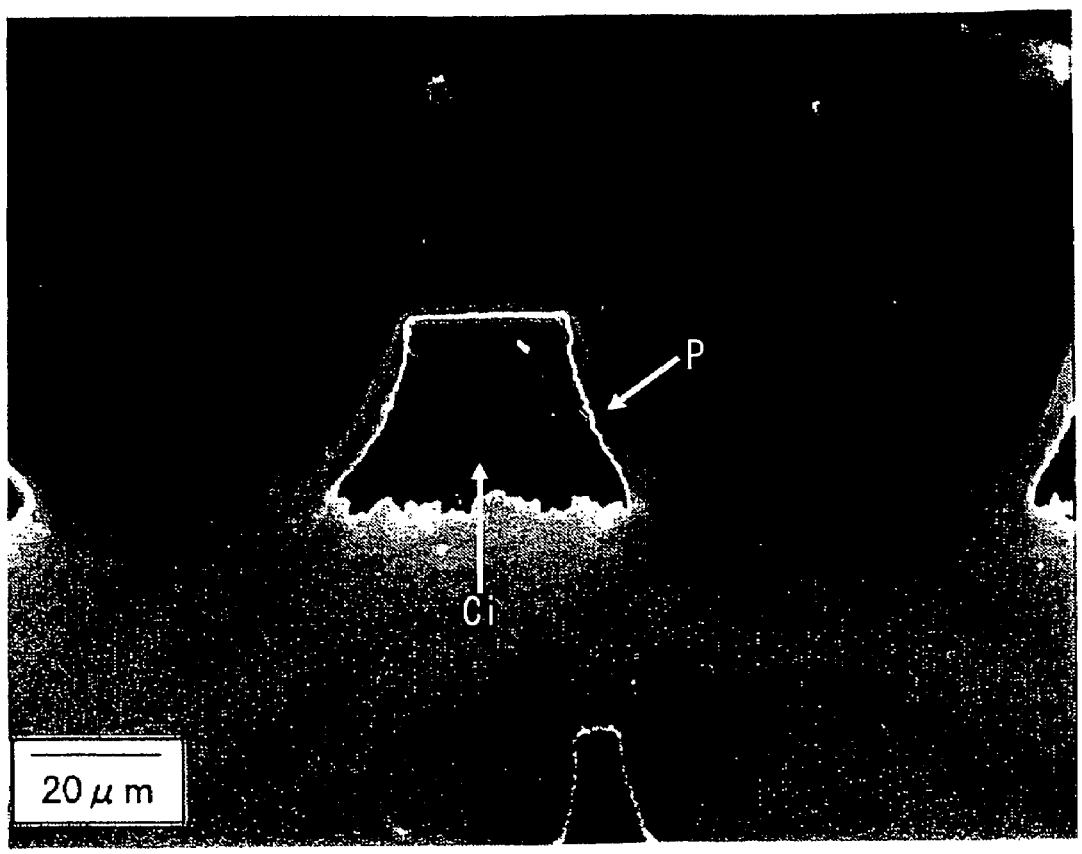
FIG. 2 is an optical microscopic photograph of the cross sectional view it shows an inner layer circuit of the MLB of the present invention.

The primer resin layer is constituted just a resin and containing no skeletal material. FIG. 2 is an optical microscopic view it shows a cross section of an inner layer circuit of the MLB of the present invention. As shown in FIG. 2, the primer resin layer P is found as a thin single resin layer lay along the surface profile of the inner layer circuit Ci on the inner layer board IB.

Such inclusion of the primer resin layer makes it possible to ensure acceptable and stable adhesion between an insulating layer resin and the inner layer circuit Ci without roughening treatment.

Arrangement on the inner layer circuit Ci, plating with tin, nickel or an alloy of these metals makes it possible to enhance the adhesion between the inner layer circuit and the primer resin layer P. The plated layer of tin, nickel or an alloy of these metals can be formed in the process, whether (I) before circuit formation, or (II) after circuit formation. However, choosing the latter procedure (II) results excellent adhesion between the inner layer circuit and the primer resin layer, because it makes possible to form plated metal layer-not only onto the upper-surface but also onto the side walls of the formed circuit. As for the referred plating methods, the electro-less plating method, the electrolytic plating method or a combination of these two plating methods may be used; however, the inner layer circuit may have a complicated pattern, and accordingly it is preferable to choose the electrolytic plating method from the viewpoint of the uniformity of electro-deposited layer.

To plate a nickel layer on the surface, following plating conditions can be used. For example, (i) a nickel sulfate bath with a nickel concentration 5 g/l to 30 g/l, the solution temperature 20 deg. C. to 50 deg. C., the pH is 2 to 4, and the current density 0.3 A/d-sq.-m to 10 A/d-sq.-m; (ii) a nickel sulfate bath with a nickel concentration 5 g/l to 30 g/l, potassium pyrophosphate 50 g/l to 500 g/l, the solution temperature 20 deg. C. to 50 deg. C., the pH 8 to 11 and the current density 0.3 A/d-sq.-m to 10 A/d-sq.-m; and (iii) a nickel sulfate bath with a nickel concentration 10 g/l to 70 g/l, boric acid 20 g/l to 60 g/l, the solution temperature 20 deg. C. to 50 deg. C., the pH 2 to 4 and the current density 1 A/d-sq.-m to 50 A/d-sq.-m; or a Watt bath can be alternatively adopted.

To plate a tin layer on the surface, following plating conditions can be used. For example, (i) a stannous sulfate bath with a tin concentration 5 g/l to 30 g/l, the solution temperature 20 deg. C. to 50 deg. C., the pH 2 to 4, and the current density 0.3 A/d-sq.-m to 10 A/d-sq.-m; and (ii) a stannous sulfate bath with a tin concentration 20 g/l to 40 g/l, sulfuric acid concentration 70 g/l to 150 g/l, the solution temperature 20 deg. C. to 35 deg. C., cresol sulfonate 70 g/l to 120 g/l, gelatin 1 g/l to 5 g/l and b-naphthol 0.5 g/l to 2 g/l and the current density 0.3 A/d-sq.-m to 3 A/d-sq.-m.

To plate a nickel-zinc alloy layer on the surface, a following plating condition can be used. For example, nickel concentration 1 g/l to 2.5 g/l with a nickel sulfate, zinc concentration of 0.1 g/l to 1 g/l with zinc pyrophosphate, potassium pyrophosphate 50 g/l to 500 g/l, the solution temperature 20 deg. C. to 50 deg. C., the pH 8 to 11 and the current density 0.3 A/d-sq.-m to 10 A/d-sq.-m.

To plate a nickel-cobalt alloy layer on the surface, a following plating condition can be used. For example, a cobalt sulfate 80 g/l to 180 g/l, nickel sulfate 80 g/l to 120 g/l, boric acid 20 g/l to 40 g/l, potassium chloride 10 g/l to 15 g/l and sodium di-hydrogen phosphate 0.1 g/l to 15 g/l, the solution temperature 30 deg. C. to 50 deg. C., the pH 3.5 to 4.5 and the current density 1 A/d-sq.-m to 10 A/d-sq.-m.

To plate a nickel-phosphorus alloy layer on the surface layer, a following plating condition can be used. For example, a nickel sulfate 120 g/l to 180 g/l, nickel chloride 35 g/l to 55 g/l, H3PO4 30 g/l to 50 g/l, H3PO3 20 g/l to 40 g/l, the solution temperature 70 deg. C. to 95 deg. C., the pH 0.5 to 1.5 and the current density 5 A/d-sq.-m to 50 A/d-sq.-m.

To plate a tin-lead alloy layer on the surface, a following plating condition can be used. For example, a stannous sulfate 20 g/l to 40 g/l, lead acetate 15 g/l to 25 g/l, sodium pyrophosphate 100 g/l to 200 g/l, EDTA di-sodium salt 15 g/l to 25 g/l, PEG-3000 0.8 g/l to 1.5 g/l, a 37% aqueous solution of formalin 0.3 ml/l to 1 ml/l, the solution temperature 45 deg. C. to 55 deg. C., the pH 8 to 10 and the current density 5 A/d-sq.-m to 20 A/d-sq.-m.

To plate a nickel-cobalt-iron alloy layer on the surface, a following plating condition can be used. For example, a cobalt sulfate 50 g/l to 300 g/l, nickel sulfate 50 g/l to 300 g/l, ferrous sulfate 50 g/l to 300 g/l, boric acid 30 g/l to 50 g/l, the solution temperature 45 deg. C. to 55 deg. C., the pH 4 to 5 and the current density 1 A/d-sq.-m to 10 A/d-sq.-m.

Moreover, the MLB having a silane coupling agent layer (not shown in the figure) between the inner layer circuit Ci and the primer resin layer P can ensure acceptable and stable adhesion between a insulating resin layer and the inner layer circuit. The silane coupling agent acts as an auxiliary agent for improving the wet-ability of the inner layer circuit surface with the primer resin to improve the adhesion. So, when both of the plated metal layer and a silane coupling agent layer is formed on the surface layer, further preferable results can be obtained.

The peel strength of the B/O-treated surface of the inner layer circuit has been assumed to be higher is the better. However, in these years, the management of the etching system has been improved and the circuit come peel off in etching process is eliminated, and the method to solve various problems in handling a PWB been established. Therefore, in these years, it has been said that peel strength of 0.8 kgf/cm is acceptable in practical application and peel strength of 1.0 kgf/cm or more is preferable.

So, when a most traditional silane coupling agents such as epoxy functional silane coupling agent, an olefin functional silane coupling agent and an acryl functional silane coupling agent are used, peel strength of the shiny side of the electro-deposited copper foil bonded to a FR-4 pre-preg shows about 0.8 kgf/cm. On the other hand, when an amino functional silane coupling agent or a mercapto functional silane coupling agent are used, peel strength shows 1.0 kgf/cm or more, so it is much preferable.

Applicable silane coupling agents will be more specifically listed below. Most of coupling agents are similar to those that used for glass cloth in pre-pregs for use in a PWB, as shown in following.
Vinyl-tri-methoxy-silane, Vinyl-phenyl-tri-methoxy-silane, g-methacryl-oxy--propyl-tri-methoxy-silane,
g-glycidoxy-propyl-tri-methoxy-silane, 4-glycidyl-butyl-tri-methoxy-silane,
g-amino-propyl-tri-ethoxy-silane,
N-b(amino-ethyl)g-amino-propyl-tri-methoxy-silane,
N-3-(4-(3-amino-propoxy)-buthoxy)propyl-3-amino-propyl-tri-methoxy-silane,
imidazole silane, triazine silane and g-mercapto-propyl-tri-methoxy-silane.

The cross sectional thickness of said primer resin layer P is preferred to be from 1 micron m to 10 micron m. The reason for making such a thin resin layer is to create little resin flow occurrence when the primer resin layer is fluidized in the hot pressing in the process of manufacturing the MLB of the present invention. In conventional lamination of a copper foil with a pre-preg as a base material, about 5 mm to 15 mm wide resin flow has been intentionally made to occur in the fringe of a 1 m square CCL to work for air elimination. It is because that there are asperities on the roughened surface of the copper foil and air is thereby incorporated. But, in the present invention, such little resin flow makes a most important factor for the purpose to satisfy acceptable adhesion between the inner layer circuit without roughening treatment and the insulating resin.

A resin flow in the present specification is measured in the following method. The resin coated copper foil for the test is prepared by coating the resin used for the primer resin layer on one surface of the copper foil in a B-stage with a predetermined thickness, about 40 micron m. Then, four 10 cm square specimens are cut from the resin coated copper foil. The four specimens are stacked one over another, and are bonded to each other under the hot-press condition, temperature 171 deg. C., pressure 14 kgf/sq.-cm with press time 10 minutes. The resin flow is calculated from the following mathematical formula (1). It is why about 40 micron m thick semi-cured resin layer is prepared to be used as specimens that thickness of the resin in the present invention is too thin to get accurate measurement results. For reference, the resin flow in a conventional pre-preg or a conventional resin coated copper foil show about 20% with 40 micron m thick resin layer.

$$\text{Resin flow (\%)} = \frac{\text{Weight of flow resin}}{\text{(Weight of laminate)} - \text{(Weight of copper foil)}} \times 100 \quad \text{[Mathematical formula 1]}$$

When the thickness of the primer resin layer P is less than 1 micron m it is difficult to coat resin on the surface thereof in an even thickness. On the other hand, when the thickness of the primer resin layer is over 10 micron m, de-lamination tends to occur in the inner layer circuit when a thermal shock is applied. It is to be noted that the thickness of the primer resin layer referred here mean a reduced thickness derived under the assumption that the primer resin is applied onto a perfect flat surface of 1 sq.-m.

Now, the resin formulations each constituting the primer resin layer will be described below. The resin formulations to be used in the present invention can be classified into two types. So, description will be made on a first resin composition and a second resin composition.

(First Resin Composition)

The first resin composition is a resin mixture comprising 20 to 80 parts by weight of an epoxy resin, 20 to 80 parts by weight of a solvent-soluble aromatic polyamide resin polymer and a curing accelerator added in an appropriate amount according to need.

The "epoxy resin" includes a resin having two or more epoxy functional in the molecule thereof, and such an epoxy resin can be used for application to electric and electronic materials. It is preferred to use one or a mixture of two or more selected from the group consisting of bisphenol-A epoxy resin, bisphenol-F epoxy resin, bisphenol-S epoxy resin, novolac epoxy resin, cresol novolac epoxy resin, alicyclic epoxy resin, brominated epoxy resin and glycidyl amine epoxy resin.

The epoxy resin is a main constituent of the resin composition, and is used in 20 parts by weight to 80 parts by weight. It is to be noted that the epoxy resin is assumed to include a curing agent to be described later on. So, when the blending ratio of the epoxy resin is less than 20 parts by weight under the condition that a curing agent is contained, the thermosetting property cannot be achieved, and the function as the binder to the base material resin and the adhesion to the metal foil are not fully achieved. While when the blending ratio of the epoxy resin exceeds 80 parts by weight, the viscosity of varnish prepared becomes too high, so it becomes difficult to apply the varnish uniformly onto the metal foil surface. Also, the blend ratio with an aromatic polyamide resin polymer to be described later will be far from best mode to show sufficient toughness after curing.

The "curing agent" for the epoxy resin can be defined as a foreign component to carry out cross-linking reaction with the epoxy resin. However, when the term "curing agent" is used, amines such as di-cyan-di-amide, imidazole and aromatic amines; phenol such as bisphenol-A and brominated bisphenol-A, novolac such as phenol novolac and cresol novolac; and acid anhydrides such as phthalic anhydride can be used. Amount added as the curing agent in relation to the epoxy resin can be derived straightforwardly from the equivalent weights of the curing agent and the epoxy resin, so it is thought essentially unnecessary to strictly and explicitly describe the blending parts of the curing agent. So, the present invention does not particularly limit the addition amount of the curing agent.

Next, the term "aromatic polyamide resin polymer" includes a polymer obtained by reaction within an aromatic polyamide resin with a rubbery resin. The aromatic polyamide resin includes a product synthesized by the condensation polymerization of an aromatic diamine with a di-carboxylic acid. In this case, for the aromatic diamine, there are used 4,4'-di-amino-di-phenyl-methane, 3,p-di-amino-di-phenyl-sulfone, m-xylene-diamine, 3,p-oxy-di-aniline and the like, while for the di-carboxylic acid, there are used phthalic acid, iso-phthalic acid, terephthalic acid, fumaric acid and the like.

The rubbery resin to be reacted with the aromatic polyamide resin includes natural and synthetic rubbers; for example, synthetic rubber includes styrene-butadiene rubber, butadiene rubber, butyl rubber and ethylene-propylene rubber. Moreover, when ensuring the heat resistance of a dielectric layer to be formed, it is better to select from heat resistant synthetic rubbers, such as nitrile rubber, chloroprene rubber, silicon rubber and urethane rubber. Because these rubbery resins are to be reacted with an aromatic polyamide resin to manufacture a copolymer, these rubbery resins each are preferably a resin provided with various functional groups at the both terminals thereof. It is particularly better to use a CTBN (carboxyl-terminated butadiene-nitrile) rubber.

Preferable blending rate for the aromatic polyamide resin is from 25 wt % to 75 wt % and rate for the rubbery resin is the balance. When the content of the aromatic polyamide resin is less than 25 wt %, the content ratio of the rubber component becomes too large, so the heat resistance goes to poor. And when the content of the aromatic polyamide resin exceeds 75 wt %, the content ratio of the aromatic polyamide resin is too large so the resin polymer may have too high hardness to be brittle after curing.

First property required to the aromatic polyamide resin polymer is being soluble in a solvent. The aromatic polyamide resin polymer is used in a blending part from 20 parts by weight to 80 parts by weight. When the content of the aromatic polyamide resin-polymer is less than 20 parts by weight the curing proceeds too under in the general press conditions for manufacturing metal clad laminates. And the cured resin polymer becomes too brittle to generate micro-cracks in the resin layer on the surface of the board. On the other hand, if the aromatic polyamide resin polymer is added in a content exceeding 80 parts by weight, no particular problem occur, but the excess addition may not result no further improvement of the toughness after curing. So, from the economical point of view, the content of 80 parts by weight may be the upper limit.

The "curing accelerator added in an appropriate amount according to need" includes a tertiary amine, imidazole, a urea curing accelerator and the like. In the present invention, the blending part of the curing accelerator is not particularly limited. This is because the addition amount of the curing accelerator can be optionally determined by the manufacturer in consideration of the manufacturing conditions and the like in the manufacturing steps of the metal clad laminate.

(Second Resin Composition)

The second resin composition includes an epoxy resin (inclusive a curing agent), a poly-ethersulfone resin and a curing accelerator added in an appropriate amount according to need.

The "epoxy resin" here is the same as in the first resin composition, so the description concerned will be thereby omitted. However, it may be noted that it is preferred to use a multifunctional epoxy resin, if possible, for the resin composition used in constituting the second resin composition.

The epoxy resin is a main constituent of the resin composition, and is used in a ratio from 5 parts by weight to 50 parts by weight. It is to be noted that the epoxy resin include the curing agent same as described for the first resin composition. So, when the blending ratio of the epoxy resin is under 5 parts by weight under the condition that a curing agent is contained, the thermosetting property is not fully achieved, and the function as the binder to the base material resin and the adhesion to the metal foil are not fully achieved. While when the blending ratio of the epoxy resin is over 50 parts by weight, the balance with the ratio of a poly-ethersulfone resin is not preferable and sufficient toughness after curing cannot be achieved.

The poly-ethersulfone resin is required to have a structure provided with hydroxy functional or amino functional at the terminals thereof and should be soluble in a solvent. Those are because that hydroxy functional and/or amino functional at the terminals react with the epoxy resin, and a property of solvent soluble makes easy the regulation of the solid content. To make well balance with the epoxy resin, the poly-ethersulfone resin is used in a blending ratio from 50 parts by weight to 95 parts by weight. Poly-ethersulfone resin in the insulating layers lowers water absorption, and it makes surface insulating resistance stable in the PWB. When the content of the poly-ethersulfone resin is under 50 parts by weight, the damage on the resin in the de-smear solution becomes sharply severe. On the other hand, when the content of the poly-ethersulfone resin is over 95 parts by weight, blistering easily occur in the solder float test at 260 deg. C.

The "curing accelerator added in an appropriate amount according to need" includes a tertiary amine, an imidazole based compound, a phosphorus compound represented by tri-phenyl phosphine, and a urea curing accelerator and the like. In the present invention, the blending ratio of the curing accelerator is not particularly limited. This is because the addition amount of the curing accelerator can be optionally determined by the manufacturer in consideration of the manufacturing conditions and the like in the press steps.

<Method for Manufacturing a MLB>

The methods for manufacturing a MLB of the present invention are different depending on the method for forming the primer resin layer whether adopting primer resin sheet or a coating varnish on the surface of the inner layer circuit board. Moreover, the methods can be classified depending on the process how both of the insulating layer and the conductive layer are formed on the primer resin layer. The methods for forming the primer resin layer will be therefore described separately according to this classification.

First, a method will be described in which a primer resin sheet is used in forming the primer resin layer. This method has two steps, preparing a primer resin sheet with a carrier film and laminating the primer resin sheet on the inner-layer board.

Figure 3:
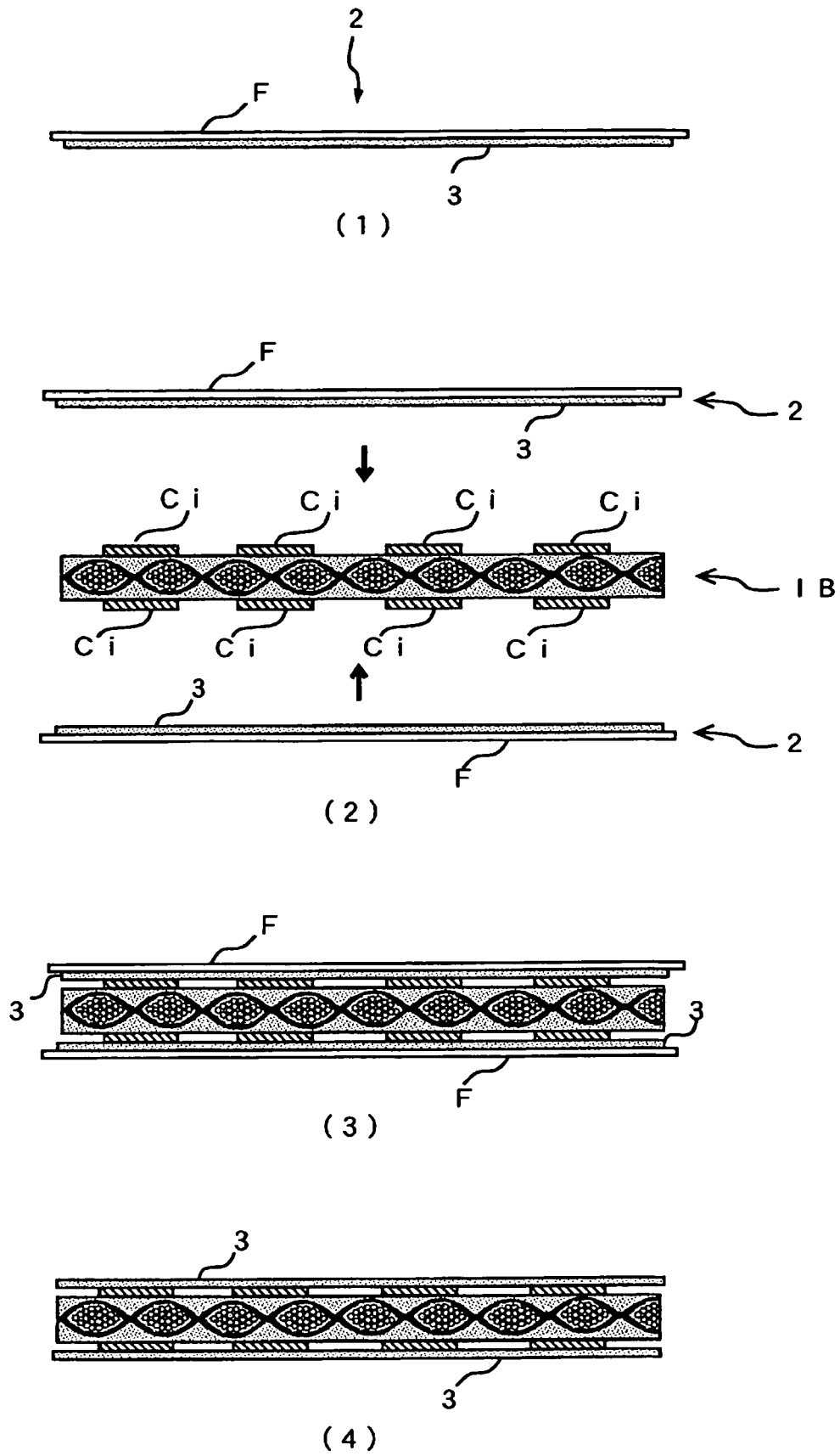
FIG. 3 is schematic sectional views it shows the manufacturing steps of the MLB of the present invention.

Process for Preparing a Primer Resin Sheet with a Carrier Film:

This process has two steps as following. Steps I is a process to prepare varnish to form the primer resin layer. And in steps II, the varnish is coated onto a carrier film F in an amount to be a primer resin layer thickness of 1 micron m to 12 micron m, and then the varnish is dried and cured to be a primer resin sheet in a B-stage with a carrier film 2 as shown in FIG. 3(1).

Steps I for preparation of the varnish will be described below. A resin mixture is prepared by mixing 20 to 80 parts by weight of an epoxy resin (inclusive of a curing agent), 20 to 80 parts by weight of a solvent soluble aromatic polyamide resin polymer and a curing accelerator to be added in an appropriate amount according to need. The individual compositions and the blending ratios have been already described above, and here description will be omitted on these matters to avoid its repetition.

Next in steps II, the above described resin mixture is dissolved in an organic solvent such as methyl ethyl ketone and/or cyclopentanone or like, to get a varnish having a resin solid content from 25 wt % to 40 wt %. The use of methyl ethyl ketone and cyclopentanone is preferable because they can be easily evaporated in the oven for curing. Next reasons why preferable are, easy eliminating of any one of the volatilized gases of these solvents from exhaust and the easy viscosity control of the varnish for coating onto the metal foil surface. However, other solvents not specified here may be used if they can dissolve all of the resin components to be used in the present invention.

For example, di-methyl-formamide, di-methyl-acetoamide, N-methyl-pyrolidone and the like can be used as the organic solvent. However, the dissolving in mixture of methyl ethyl ketone and cyclopentanone is most preferable at present from the environmental viewpoint. No particular constraint is imposed on the mixing ratios of the solvents. However, cyclopetanone may be sometimes inevitably contained in the supplied aromatic polyamide resin polymer varnish, so it is preferable to use methyl ethyl ketone as an additional solvent to ease evaporation in the curing oven when used for such process.

By use of the solvent described above, the varnish is prepared to have 25 wt % to 40 wt % of the resin solid content. The range of the resin solid content is a range suitable for ensuring the most excellent film thickness when the varnish is coated onto the surface of the carrier film. When the solid content is less than 25 wt %, the viscosity of the varnish is too low, so immediately after the varnish has been coated onto the surface of the carrier film, the varnish flows to make coating thickness un-even. On the other hand, when the resin solid content exceeds 40 wt %, too high viscosity of the varnish makes the formation of a thin layer difficult on the surface of the carrier film.

No particular constraint is imposed on the application method for coating varnish obtained as described above onto the surface of the carrier film. However, it is preferable to use a so-called gravure coater which is favorable for thin film formation when consider on the requirement to get a thickness of 1 micron m to 12 micron m. Heating conditions to cure to be a B-stage after coating a varnish on the carrier film depends on the characteristics of the resin composition.

In this connection, PET film, PEN film, fluorocarbon film and polyethylene film and like can be used for carrier film.

Process for Placing the Primer Resin Sheet on the Inner-layer Circuit Board:

In the process shown in FIG. 3(2), the primer resin surface of the primer resin sheet with a carrier film 2 is superposed to the inner layer circuit surface on the inner layer circuit board IB. Then it forms a placed state as shown in FIG. 3(3), and then the carrier film F is removed as shown in FIG. 3(4).

When the silane coupling agent layer is provided, the silane coupling agent is adsorbed to the inner layer circuit surface before the primer resin sheet with a carrier film 2 is superposed against the inner layer circuit surface of the inner layer board IB as described above. It is to be noted that depiction of the silane coupling agent layer is omitted in the figure.

As for process of the formation of the silane coupling agent layer, traditional way of dipping, showering, and splashing methods are available, without any particular constraint imposed there on. In conformity with the steps design, any method may be adopted in which the solution containing silane coupling agent can be contacted most uniformly with the inner layer circuit surface and adsorbed thereby.

Mainly these silane coupling agents are used as an aqueous solution of 0.5 to 10 g/l concentration in room temperature. The silane coupling agent forms a layer by condensation bonding with the OH functional on the metal foil surface. So, solution in too high concentration over 10 g/l cannot work to enhance effect thereof and also do not help fasten adsorption rate. However, when the concentration is under 0.5 g/l, the adsorption rate of the silane coupling agent is too slow and it may show less commercial profit with non-uniform adsorption layer in the area. So, the concentration should be determined according to the line speed or else.

Another process for forming the primer resin layer is coating varnish on the surface of the inner layer circuit board. So, this process requires the procedure, coating of the varnish onto the surface of the inner layer circuit board and curing of the applied resin composition.

Figure 4:
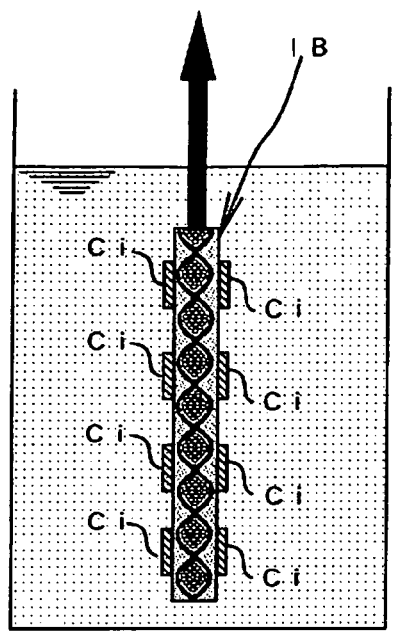
FIG. 4 is schematic sectional views it shows the manufacturing steps of the MLB of the present invention.
Figure 4:
Figure 4:
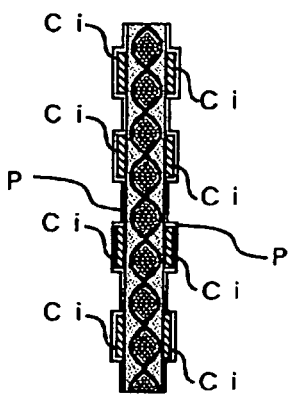
Figure 4:
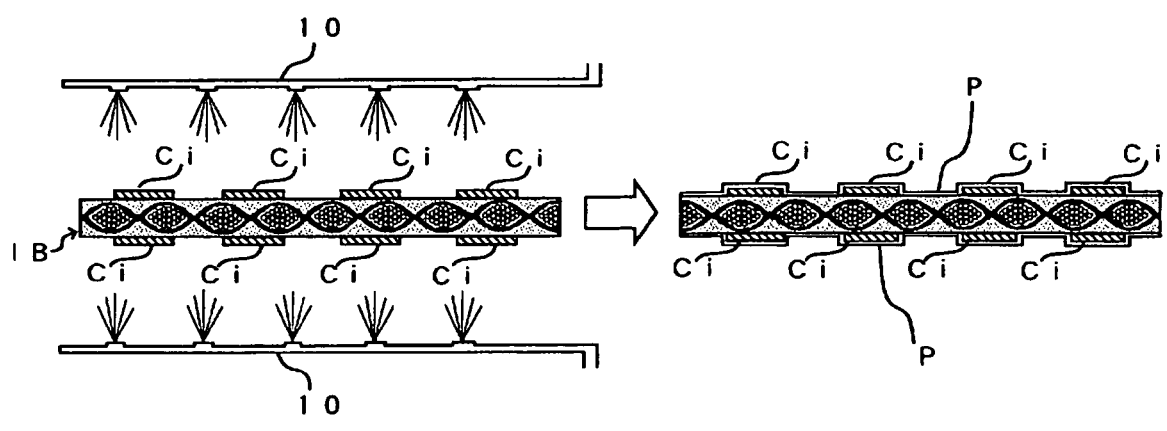

Process for Coating the Primer Resin Varnish Onto the Inner-layer Circuit Board:

To form the resin composition to be the primer resin layer onto the surface of the inner layer circuit board, it is preferable to adopt a process to dip the inner layer circuit board IB into the varnish R and then taken out as shown in FIG. 4(A). Or to splash the varnish onto the surface of the inner layer circuit board IB as shown in FIG. 4(B). The latter process is more preferable in the case where a primer resin layer is formed only on one surface of the inner layer circuit board. Then after drying and heating, a 1 micron m to 12 micron m thick primer resin layer in a B-stage is formed. In this case, heating conditions to cure to be a B-stage after coating a varnish on the inner layer circuit board also depends on the characteristics of the resin composition.

It is noted that the resin composition used here may be the same resin composition as used in the above described primer resin sheet. However, for the purpose of adopting one of the coating methods, the dipping and splashing methods, the properties of the varnish are required to conform to such processing methods. More specifically, the solid content in the varnish should be less than the solid content in the case coating of the primer sheet on the carrier film. So, the resin solid content is preferably in the range from 8 wt % to 15 wt %. When the resin solid content is over 15 wt % with too high viscosity, the liquid draining in the dipping method is degraded, and the splashing uniformity in the spray method is degraded. On the other hand, when the resin solid content is less than 8 wt %, the viscosity of the varnish itself is too low, and accordingly the formation of a resin film on the surface of the inner layer circuit board in preferable thickness becomes difficult. Preferable resin solid content of the varnish to be used in the coating method is in a range from 10 wt % to 12 wt %, from the viewpoint of the processing stability.

Process for Lamination:

Lamination is a process to laminate an insulating layer and a conductive layer further on the surface of the inner layer circuit board with primer resin sheet or an inner layer circuit board with coated primer resin layer in a B-stage, to make a multi-layered metal clad laminate by hot pressing. In this connection, the two or more process to be described below may be adopted. With reference to the relevant drawings, the individual methods will be described below.

(Method Using a Traditional Pre-preg)

Figure 5:
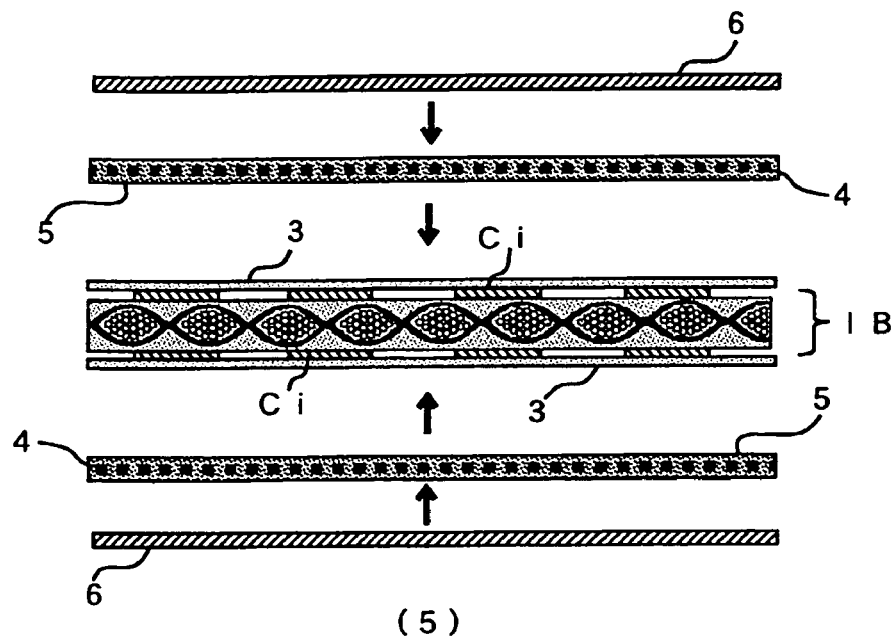
FIG. 5 is schematic sectional views it shows the manufacturing steps of the MLB of the present invention.
Figure 5:
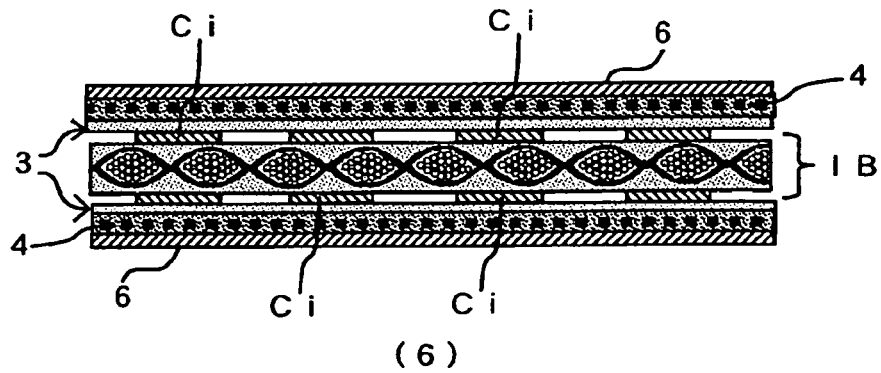
Figure 5:
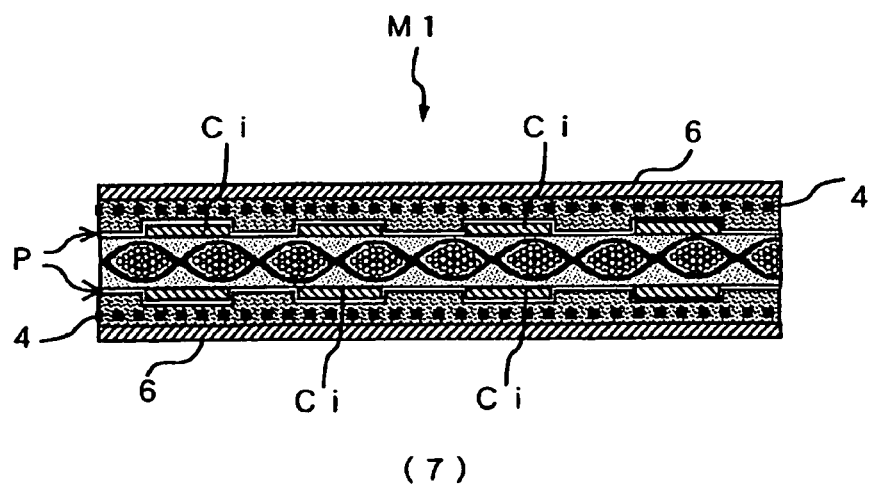

In this procedure, a pre-preg 5 and a metal foil 6 are sequentially stacked on the primer resin sheets 3 without carrier films F as shown in FIG. 5(5). Then, stacked book as shown in FIG. 5(6) is hot pressed for bonding to get a multi-layered metal clad laminate M1. After hot pressing, the primer resin sheets 3 on both sides are deformed to be a primer resin layer P lay along the surface profile of the inner layer board IB as shown in FIG. 5(7). In this case, no particular constraints are imposed on the heating temperature and pressure and others in press conditions. It is to be noted that in the drawings used for illustrating the present invention, each of the deformed primer resin layer P after hot pressing is shown as a white layer.

Figure 6:
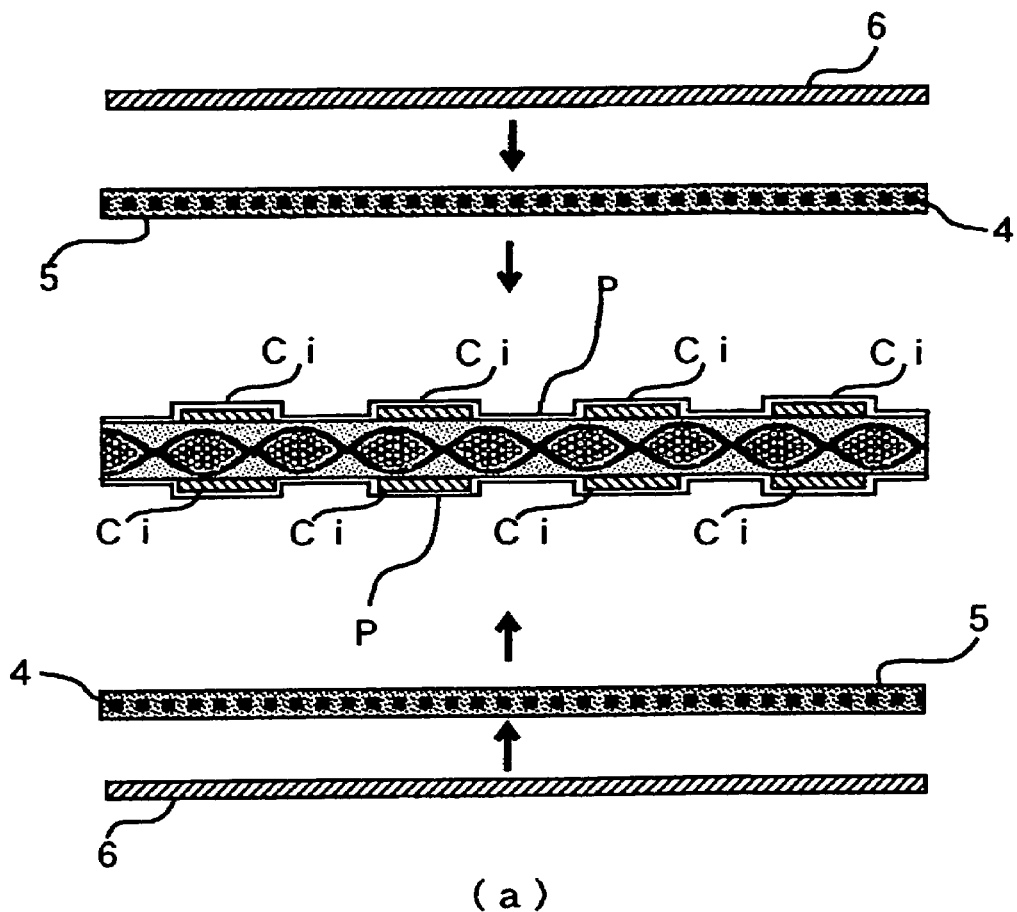
FIG. 6 is schematic sectional views it shows the manufacturing steps of the MLB of the present invention.
Figure 6:
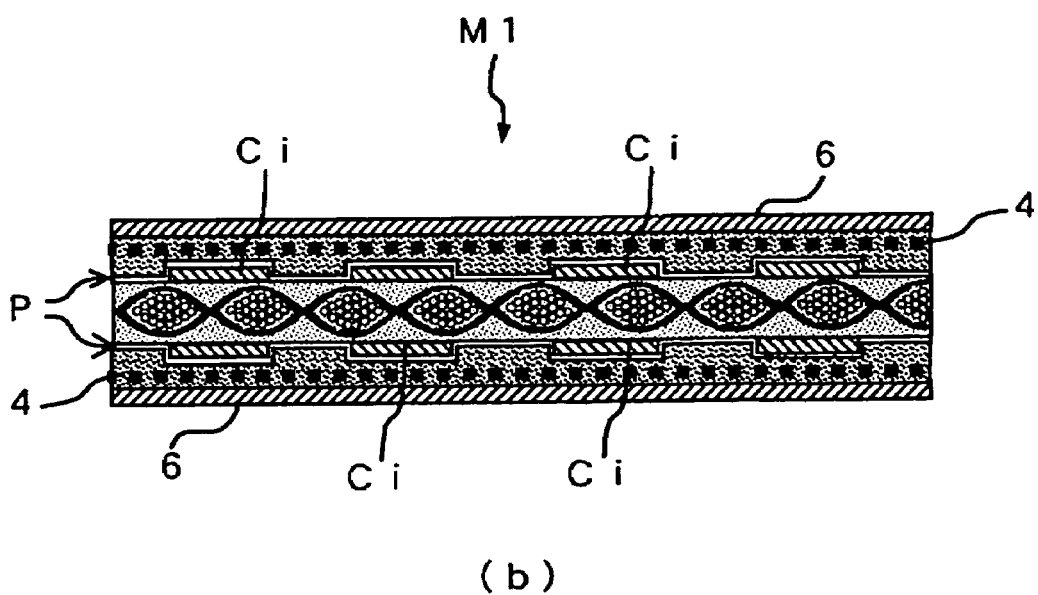

When each of the primer resin layer P was formed by coating on the surface of the inner layer circuit board and cured to be a B-stage, the profile of the primer resin layer has already been formed along the surface profile of the inner layer circuit board. A pre-preg 5 and a metal foil 6 are sequentially stacked on each of the surfaces of the inner layer circuit board IB as shown in FIG. 6(*a*). Then, hot pressing is carried out for bonding to get a multi-layered metal clad laminate M1 in which the fluidized resin of the pre-preg 5 covers the asperities of the primer resin layer P and is cured to be shown in FIG. 6(*b*). Also in this case, no particular constraints are imposed on the heating temperature, pressure and other press conditions.

The concept for metal foil 6 in the present specification is including a metal foil with a carrier foil also. A metal foil with a carrier foil shows construction that the carrier foil is fixed onto opposite surface of the metal foil surface to be bonded to the base material. And the metal foil with a carrier foil is subjected to pressing to form a laminate, and thereafter the carrier foil is released, thus the laminate is used in the same manner as a conventional metal clad laminate. The advantages in use of a metal foil with a carrier foil is not only prevention from foreign materials placing on and staining of the surface of the conductive layer but also protection of the surface of the metal foil from damages such as scratches until just before the etching.

(Method Using Resin Coated Metal Foils)

Figure 7:
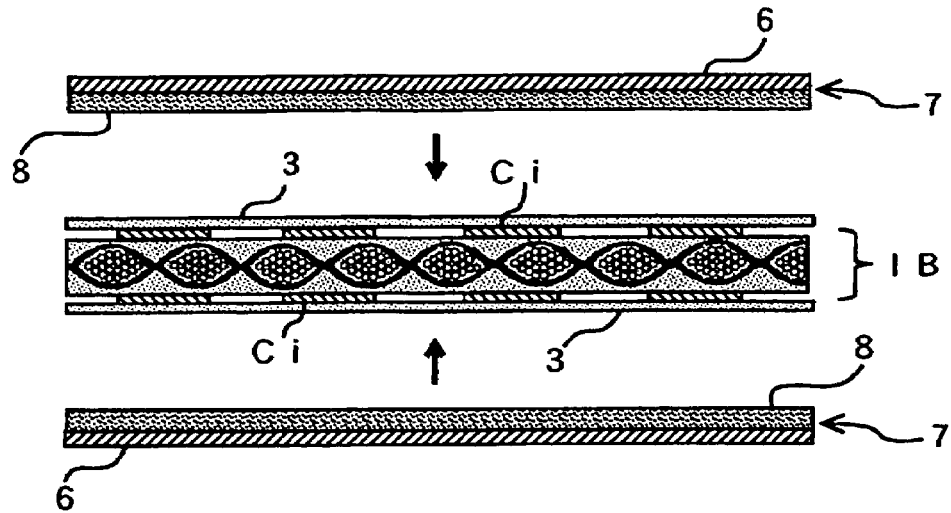
FIG. 7 is schematic sectional views it shows the manufacturing steps of the MLB of the present invention.
Figure 7:
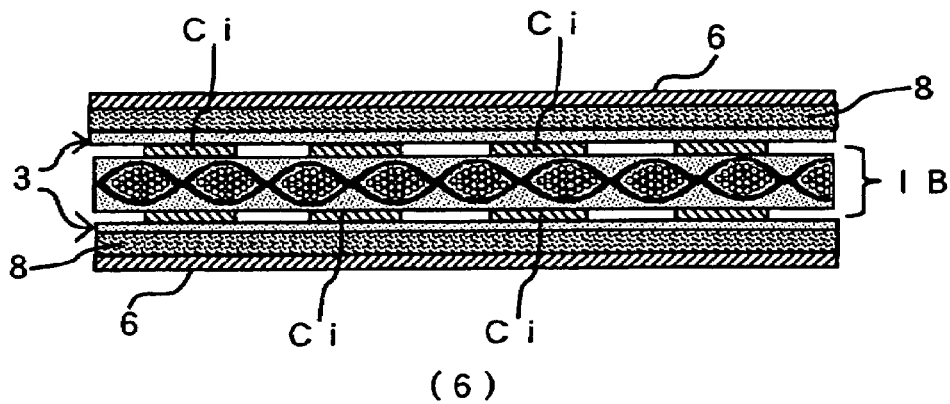
Figure 7:
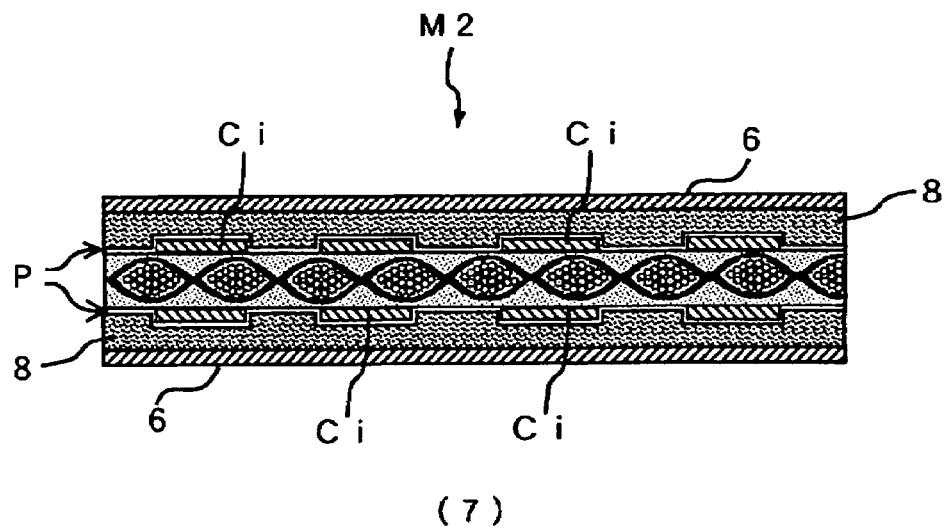

The resin coated metal foil 7 referred here is a metal foil 6 which has coated resin layer 8 without skeletal material to constitute the insulating layer of the PWB as shown in FIG. 7(5 to 7).

In this case, for the resin layer 8, all the resin formulations usable for the insulating layer of the PWB can be adopted. However, it is preferable to use the resin composition for constituting the primer resin layer P. This is because the resin to be used for constituting the primer resin layer P of the present invention has less resin flow, so the control of the thickness of the insulating layers in the final product becomes easy. However, it is unnecessary to make the composition concerned exactly the same as the composition of the primer resin layer P. This is because the resin layer thickness of the resin coated metal foil 7 and the thickness of primer resin layer are usually different from each other, and accordingly, it is preferable to optionally select a resin formulation which is most suitable for forming a resin layer having a target thickness for the resin coated metal foil.

In the procedures in this case, the resin layer 8 of the resin coated metal foil 7 is placed on the primer resin sheet 3 without carrier film F as shown in FIG. 3(4), to be as shown in FIG. 7(5). Then, as shown in FIG. 7(6), hot pressing is carried out for bonding to get a multi-layered metal clad laminate M2. After hot pressing, the primer resin sheets 3 on both sides are deformed to be a primer resin layer P lay along the surface profile of the inner layer board IB as shown in FIG. 7(7). Also in this case, no particular constraints are imposed on the heating temperature, pressure and other conditions in the pressing.

Figure 8:
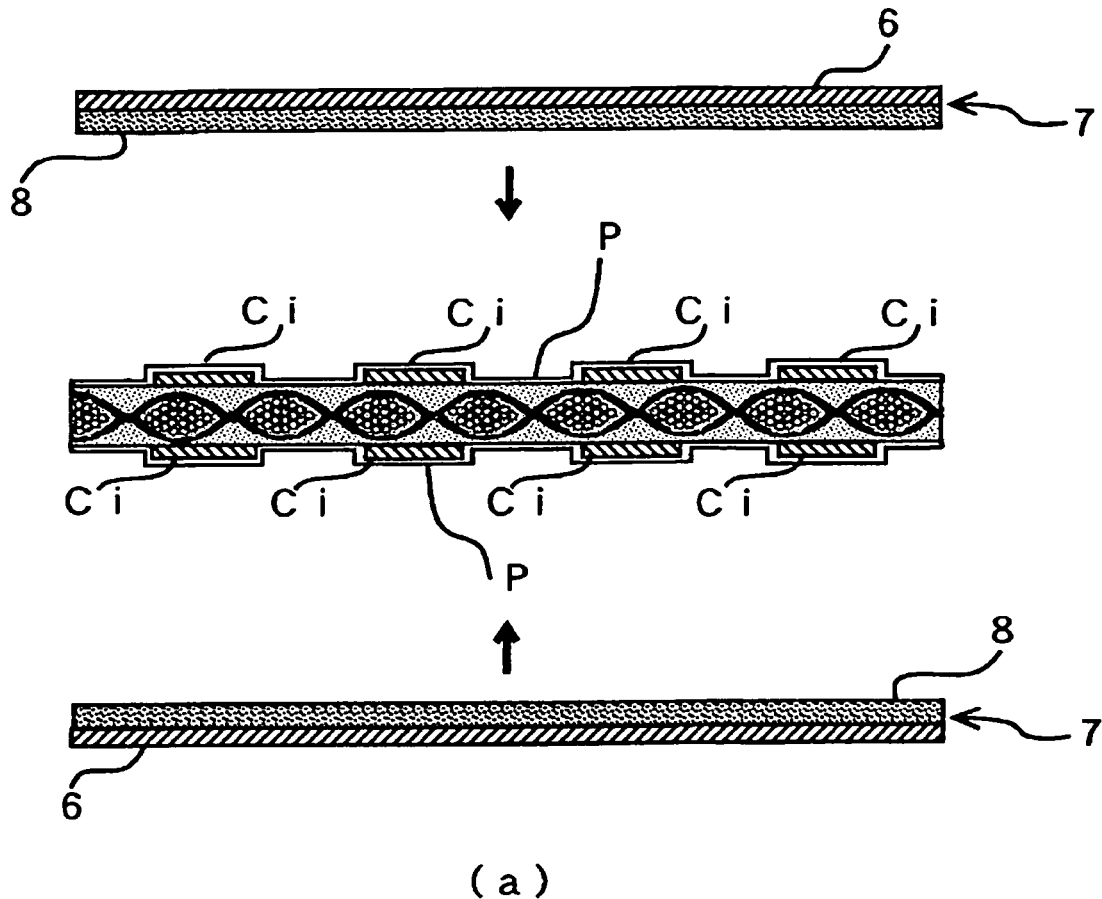
FIG. 8 is schematic sectional views it shows the manufacturing steps of the MLB of the present invention.
Figure 8:
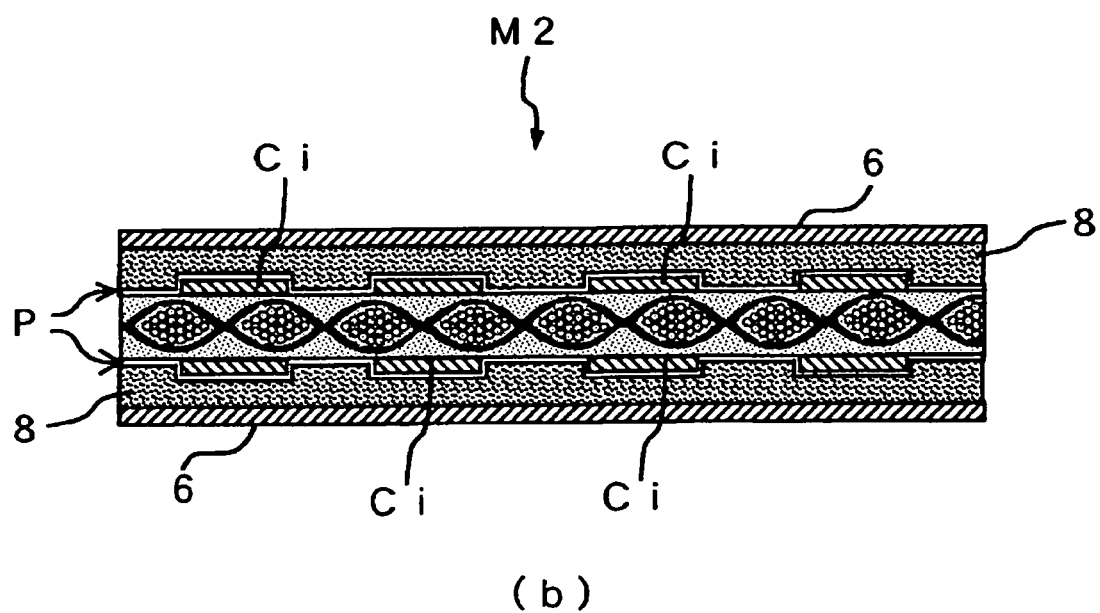

When the primer resin layer P were formed by coating on the surfaces of the inner layer circuit board, the profile of each of the primer resin layer has already been formed along the surface profile of the inner layer circuit board. The resin coated metal surface 7 are placed on the surface of the inner layer circuit board IB as shown in FIG. 8(*a*). Then, hot pressing is carried out for bonding to get a multi-layered metal clad laminate M2 in which the fluidized resin component of the resin layers 8 of the resin coated metal foil 7 on both sides covers the asperities of the primer resin layer P and is cured to be shown in FIG. 8(*b*). Also in this case, no particular constraints are imposed on the heating temperature, pressure and other conditions in the pressing.

(Case Using Skeletal Material Reinforced Resin Coated Metal Foils)

Figure 9:
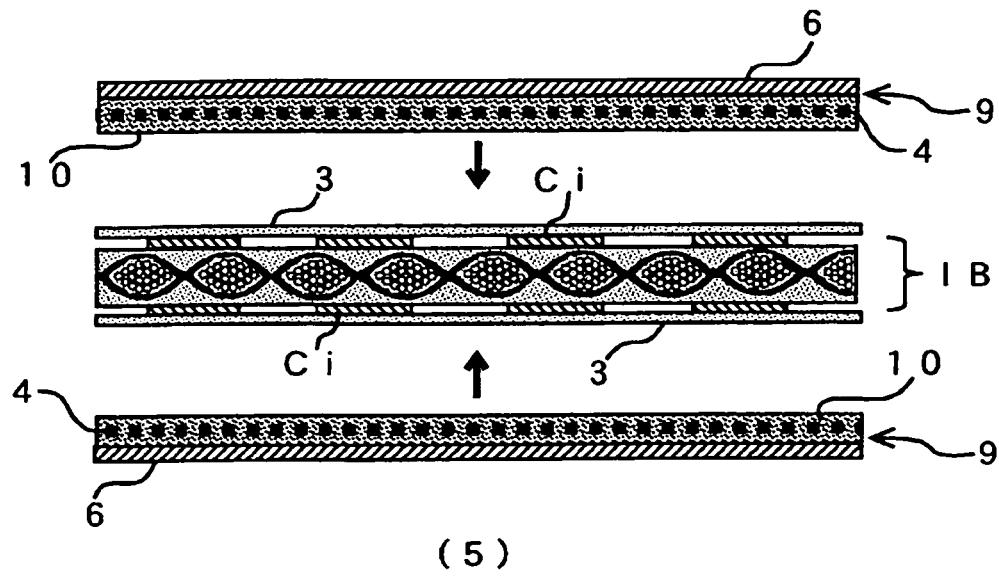
FIG. 9 is schematic sectional views it shows the manufacturing steps of the MLB of the present invention.
Figure 9:
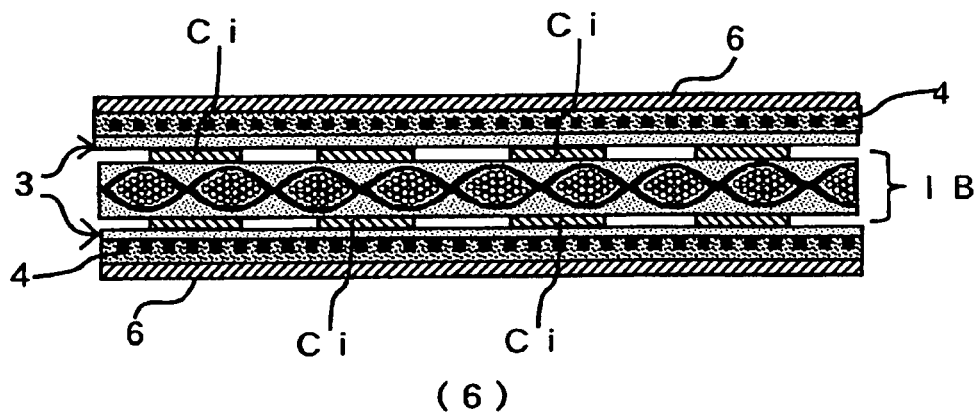
Figure 9:
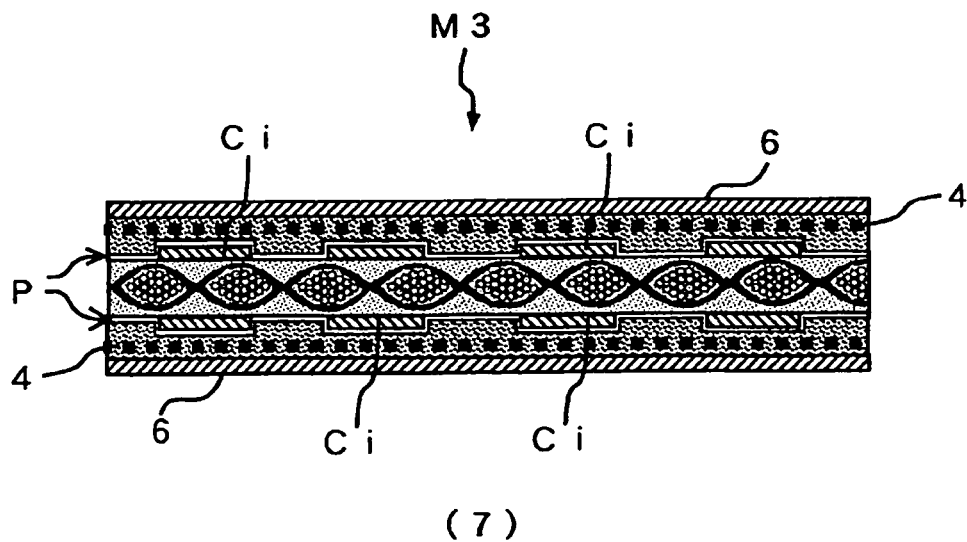

The skeletal material reinforced resin coated metal surface 9 as shown in FIG. 9(5) is a metal foil 6 which has resin layer with skeletal material 4 on the bonding side, to constitute the insulating layer of the PWB. And the skeletal material reinforced resin coated metal surface 9 is manufactured by a method described below.

In the procedures in the case where skeletal material reinforced resin coated metal surface 9 are used with primer resin sheet, each of the skeletal material reinforced resin layers 10 is placed on the primer resin sheet concerned 3 as shown in FIG. 3(4), to be placed in a state shown in FIG. 9(5). Then, as shown in FIG. 9(6), hot pressing is carried out for bonding to get a multi-layered metal clad laminate M3 provided with primer resin layer P. After hot pressing, the primer resin sheets 3 each are deformed to lay along the surface profile of the inner layer board IB as shown in FIG. 9(7). Also in this case, no particular constraints are imposed on the heating temperature, pressure and other conditions in the pressing.

Figure 10:
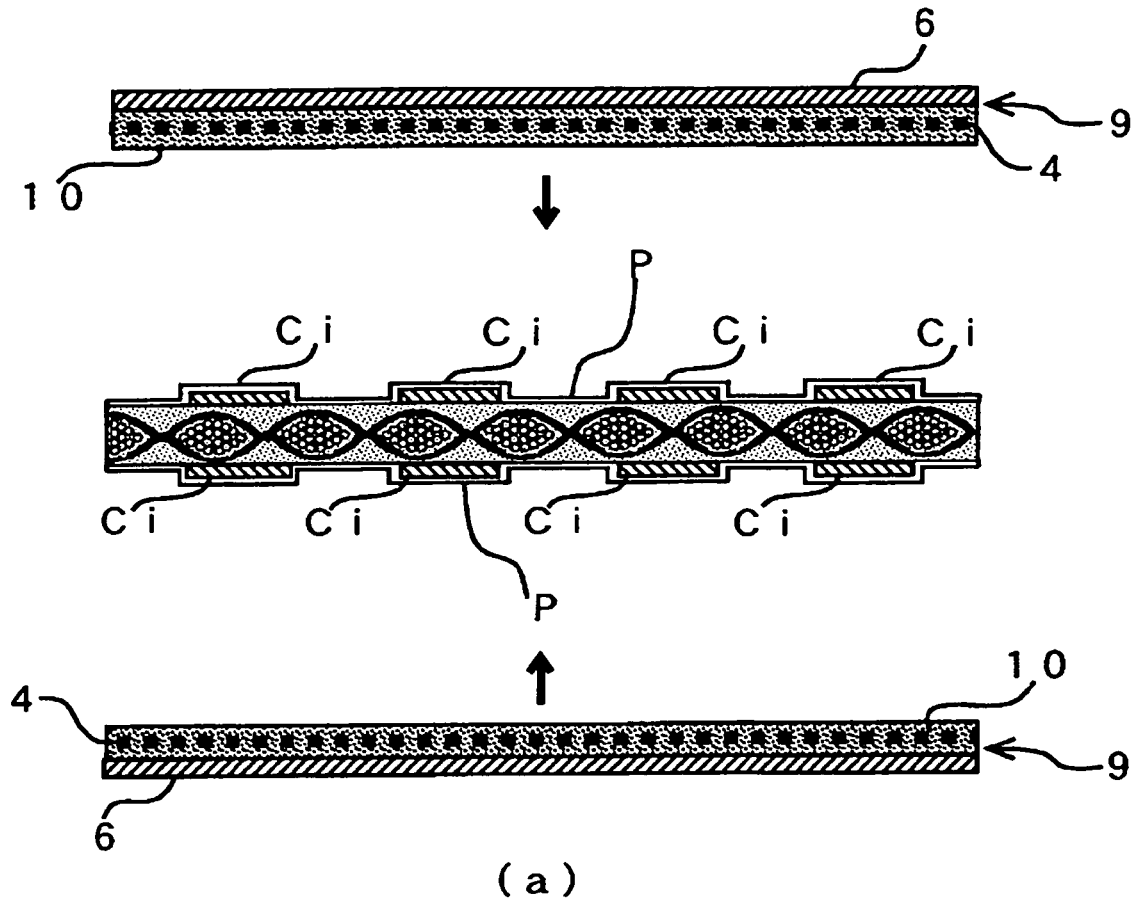
FIG. 10 is schematic sectional views it shows the manufacturing steps of the MLB of the present invention.
Figure 10:
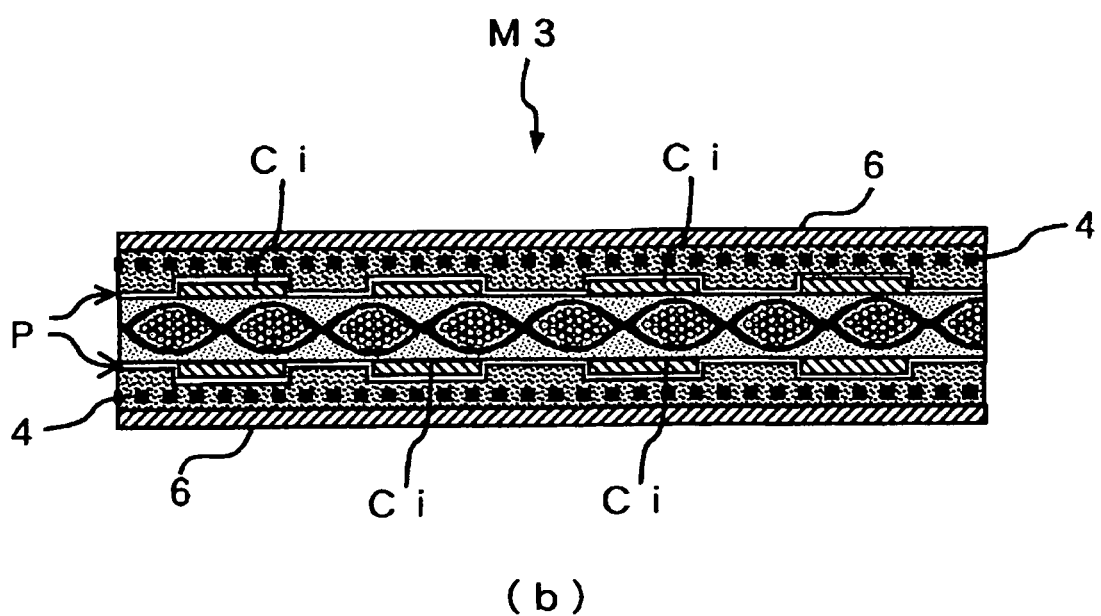

In the case when the primer resin layer were formed by coating on the surfaces of the inner layer circuit board, the profile of each of the primer resin layer has already been formed along the surface profile of the inner layer circuit board. The skeletal material reinforced resin coated metal foils 9 are placed on the surface of the inner layer circuit board IB as shown in FIG. 10(*a*). Then, hot pressing is carried out for bonding to get a multi-layered metal clad laminate M3. In the process, the fluidized resin component covers the asperities of the primer resin layer P of the inner layer circuit board and is cured to be as shown in FIG. 10(*b*). Also in this case, no particular constraints are imposed on the heating temperature, pressure and other conditions in the pressing.

Figure 11:
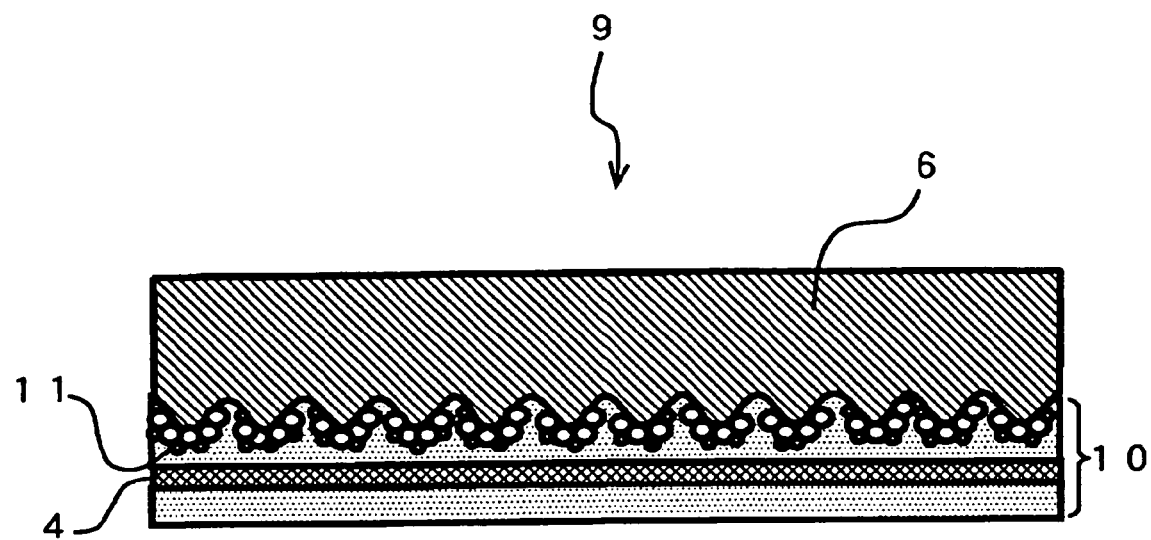
FIG. 11 is a schematic sectional view it shows a skeletal material reinforced resin coated metal foil used in manufacturing of the MLB of the present invention.

FIG. 11 is an schematic sectional view of the skeletal material reinforced resin coated metal foil 9, provided with the skeletal material reinforced resin layer 10 on the roughened surface 11 of the metal foil 6.

Although the skeletal material reinforced resin coated metal surface 9 may be manufactured by means of several methods, hereinafter manufacturing method suitable for a case where a thin skeletal material is used will be described.

Figure 12:
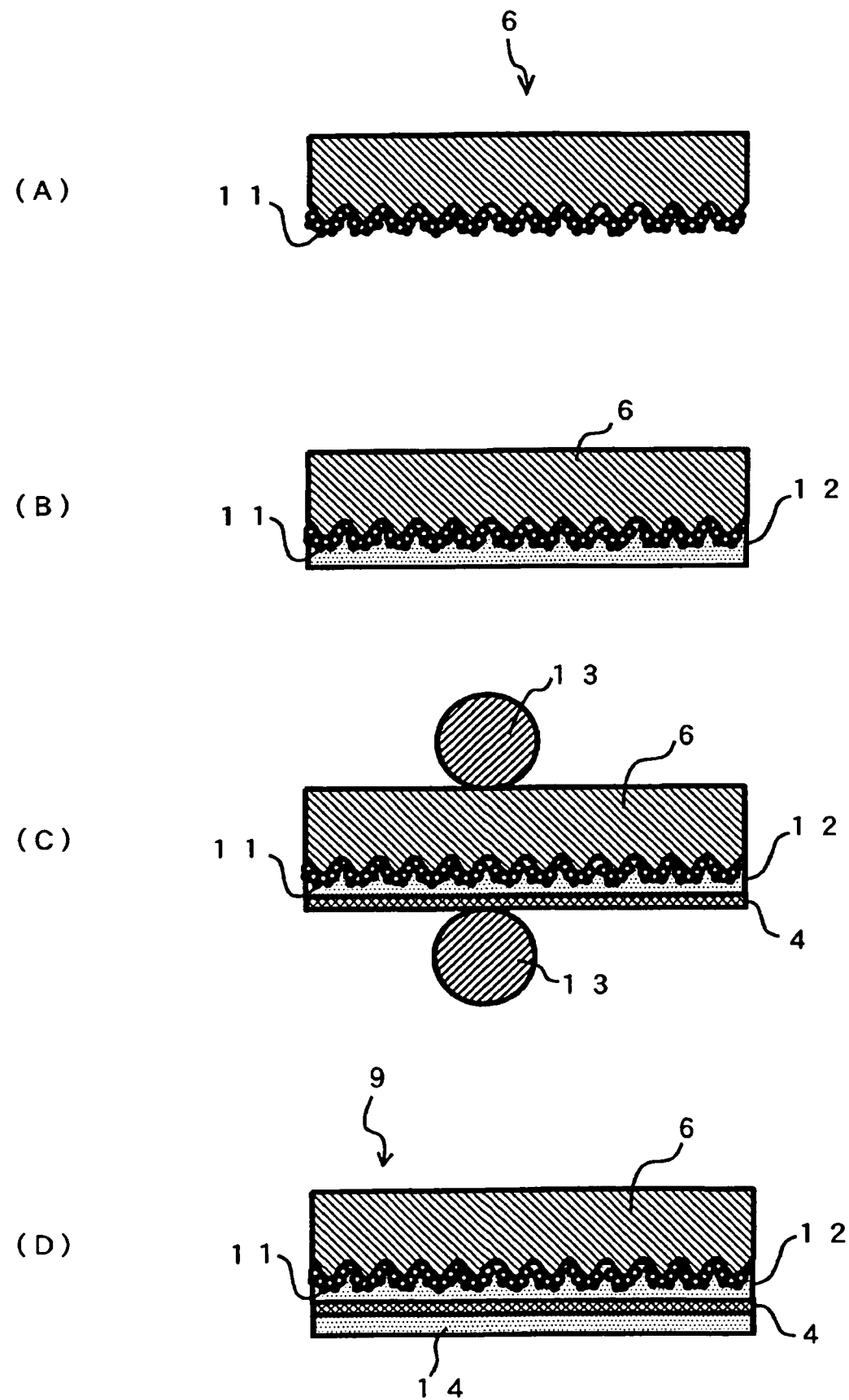
FIG. 12 is schematic views it shows the manufacturing steps of a skeletal material reinforced resin coated metal foil.

First process is laminating of a skeletal material onto the resin coated metal foil. As shown in FIG. 12(A), a first resin layer 12 in a B-stage is formed on one surface of the metal foil 6. The metal foil 6 can be any metal foil which is used in an electronic material i.e. a PWB without any constraint on the manufacturing method, such as a rolled copper foil or an electro-deposited copper foil.

An epoxy resin is preferably used for the first thermosetting resin layer 12 shown in FIG. 12(B). This is because an epoxy resin is widely used in application to a PWB. So, no particular constraint is required for the resin constituting the first thermosetting resin layer 12, as long as the resin provided with thermosetting property and usable for a PWB in the fields of electric and electronic materials. The first thermosetting resin layer 12 can be formed on the surface of the metal foil by means of either coating a resin varnish or bonding a resin film in a B-stage. And when the varnish contains epoxy resin with a curing agent with a curing accelerator, methyl ethyl ketone is preferred as a solvent to manage viscosity of the varnish.

The first thermosetting resin layer 12 formed on the surface of the metal foil should be maintained in a B-stage. This is to impregnate resin satisfactorily into the skeletal material 4, which is a non-woven paper or woven cloth. So, the resin varnish is coated onto the surface of the metal foil 6 and then cured to be a B-stage. In curing process using a hot-air oven or the like, it is necessary to manage the curing degree.

The thickness of the first thermosetting resin layer 12 formed on the surface of the metal foil 6 as shown in FIG. 12(B) is determined in consideration of the thickness of the skeletal material 4 as followings. More specifically, the thickness of the first thermosetting resin layer 12 is required to be equal to or less than the thickness of the skeletal material 4. As the skeletal material 4 is passing through the compression rolls 13 for compression bonding to the first thermosetting resin layer 12 as shown in FIG. 12(C), if the first thermosetting resin layer 12 was thicker than the skeletal material 4, resin will make side flow to put on the equipment. If the compression rolls 13 are polluted in such a way, the resin may transfer onto the surface of the metal foil 6 in the processing and make product rejective with dirt.

On the other hand, the lower limit thickness of the first thermosetting resin layer 12 can be determined whether the first thermosetting resin layer 12 can perfectly cover the asperities of the roughened surface 11, because roughened surface 11 of the metal foil 6 has asperities. This is because when the asperities of the roughened surface 11 of the metal foil 6 contacts directly to the skeletal material 4, sufficient bonding strength cannot be achieved and shows poor migration performance.

As described above, the first thermosetting resin layer 12 have been formed on the surface of the metal foil 6, and then the skeletal material 4 is bonded to the first thermosetting resin layer 12 by mean of compression rolls 13 as shown in FIG. 12(C). For the skeletal material 4, a non-woven paper or woven cloth can be used, and the skeletal material 4 is used to reinforce the resin coated metal foil. The skeletal material 4 is bonded to the first thermosetting resin layer 12 by mean of the compression rolls 13 with a certain load. More specifically, when the skeletal material 4 is bonded to the first thermosetting resin layer 12 in a B-stage, the compression rolls 13 may be a heating device, and bonding is carried out by loading a some compression. This is to impregnate a certain part of the re-fluidized resin 12 in a B-stage into the skeletal material 4.

For skeletal material 4, a paper or cloth is used. More specifically, a non-woven paper or woven cloth made of glass fiber or aramid fiber is preferably used. This is because these types of paper or cloth have used in a PWB applications for long time and has high reliability. However, it is not necessary to impose any particular constraint on the quality of the non-woven paper or woven cloth, and any material may be used as long as the material can be used for application to a PWB and has sufficient mechanical properties.

Additionally, although no particular constraint is imposed on the thickness of the skeletal material 4, the adoption of the method makes it possible to use a thin non-woven paper or woven cloth of 50 micron m or less that has never be used for pre-preg. Conventional method for preparation of a pre-preg is dipping a non-woven paper or woven cloth into a resin varnish and then taking out the cloth to cure into a B-stage. So, a thin non-woven paper of 50 micron m or less or a thin woven cloth of 20 micron m or less are not easy to handle because its weak mechanical strength makes it broken or damaged easily. Alternatively, even when such a cloth is not broken or damaged, the tension applied along the machine direction elongate the paper or cloth and resin is cured as it is in the process. So mechanical properties of the circuit board, expansion/contraction coefficients, exhibits a large difference within the machine direction and transverse direction of a pre-preg manufactured, and it cause serious problem in the dimensional stability in the so-called precise a PWB.

On the contrary, the adoption of the present method for manufacturing the skeletal material reinforced resin coated metal foils eliminates the above described breakage or damage even when a thin non-woven paper of 50 micron m or less or a woven cloth of 20 micron m or less is used. In view of the current technical situation for manufacturing non-woven paper or woven cloth, it is said that the lower limit thickness supplied with a full quality guarantee is 45 micron m for non-woven paper and 20 micron m for woven cloth. It can be anticipated that further thinner non-woven paper or woven cloth will be able to be manufactured in the future.

After the bonding of the non-woven paper or woven cloth, a second thermosetting resin layer 14 is formed on the non-woven paper or woven cloth and then a resin layer is cured to be a B-stage as shown in FIG. 12(D). An epoxy resin used for the second thermosetting resin layer 14 is same as the first thermosetting resin layer 12 described above. However, no particular constraint is required for the resin constituting the second thermosetting resin layer 14, as long as the resin usable for a PWB as described on the first thermosetting resin layer 12. As a method for forming the second thermosetting resin layer 14, the method for forming the first thermosetting resin layer 12 can be applied in a similar manner.

The second thermosetting resin layer 14 formed on the surface of the metal foil should be in a B-stage. This is to use the second thermosetting resin layer 14 as insulating layer of the PWB by laminating together with the other materials of the PWB.

The thickness of the second thermosetting resin layer 14 is determined, as described below, in consideration of the thickness of the skeletal material 4. More specifically, because the thickness of the first thermosetting resin layer 12 is equal to or less than the thickness of the skeletal material 4 as described above, the first thermosetting resin layer 12 alone may not perfectly coat the skeletal material 4 even when the skeletal material 4 is bonded with compression to the fluidized first thermosetting resin layer 12. So, the second thermosetting resin layer 14 is formed to fully coat the skeletal material 4. Moreover, it may show stable adhesion of the second thermosetting resin layer 14 with the primer resin layer P on the inner layer circuit Ci when laminated also.

Second process for obtaining a skeletal material reinforced resin coated metal surface 9 is described below. The thermosetting resin layer as varnish is coated on one surface of a metal foil; a non-woven paper or woven cloth as a skeletal material is placed on the varnish layer; the varnish is impregnated into the non-woven paper or woven cloth and fully cover the skeletal material; the varnish is dried and cured to form a B-stage; and thus a resin layer containing a non-woven paper or woven cloth in a B-stage is formed on one surface of the metal foil as a skeletal material reinforced resin coated metal foil.

Figure 13:
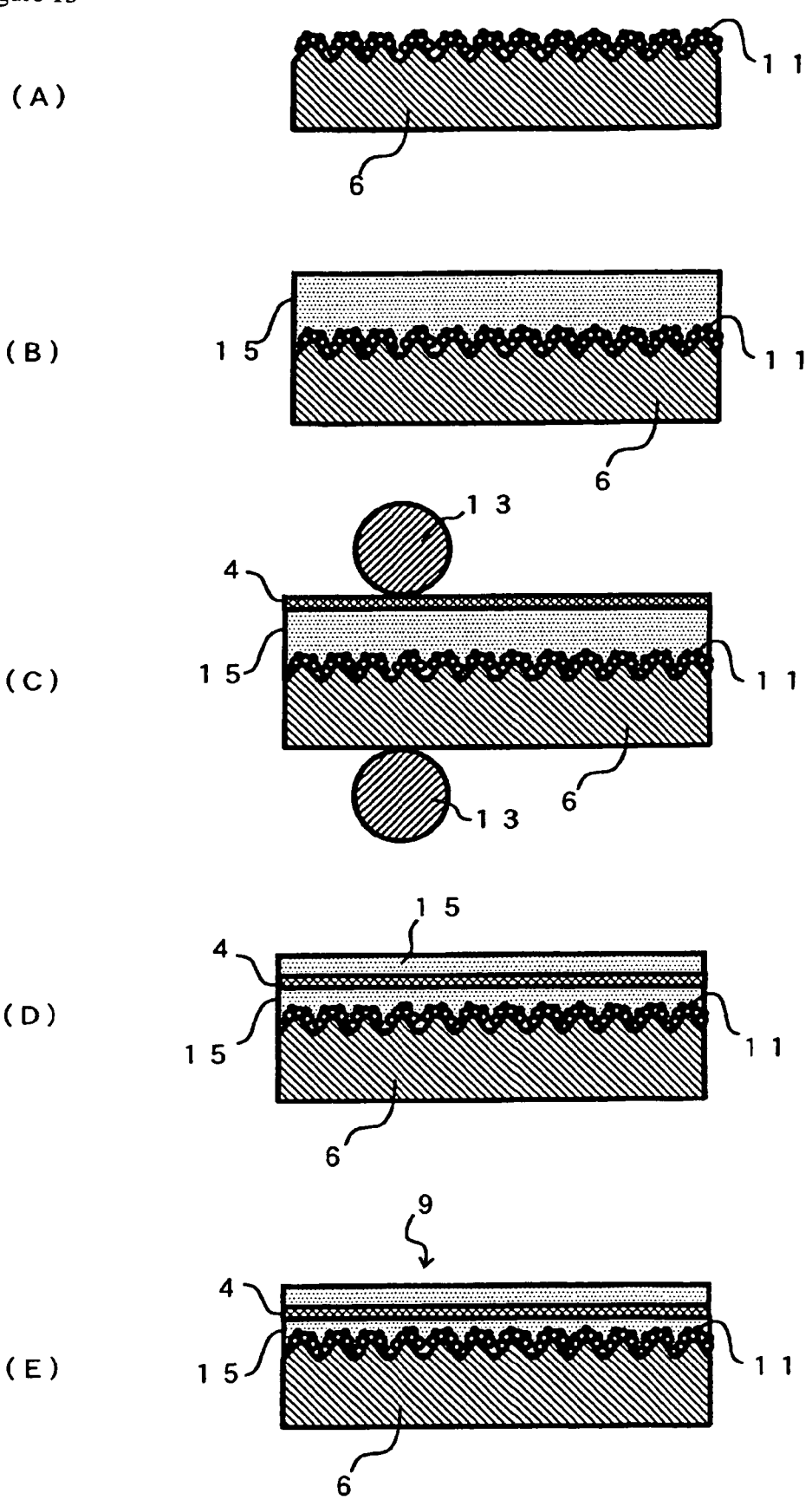
FIG. 13 is schematic views it shows the manufacturing steps of a skeletal material reinforced resin coated metal foil.

This manufacturing process is carried out in the steps schematically shown in FIG. 13. A thermosetting resin varnish 15 is coated on one surface of the metal foil 6 to be as shown in FIG. 13(B). And then, the skeletal material 4 is placed on the surface of the thermosetting resin varnish 15 as shown in FIG. 13(C). Then the thermosetting resin varnish 15 is impregnated into the skeletal material 4 by the capillary phenomenon in the skeletal material 4 made of the glass fiber or aramid fiber to be shown in FIG. 13(D). Further, the thermosetting resin varnish come to fully coat the surface of the skeletal material 4 and then dried and cured. Thus, the skeletal material reinforced resin coated metal foil 9 shown in FIG. 13(E) is obtained.

In this case, it is preferable to impregnate resin into to fully coat the skeletal material 4 in consideration of the following points in the steps shown in FIGS. 13(C) and 13(D). The thermosetting resin varnish 15 is coated on the metal foil surface, so such a resin varnish generally contains a large amount of solvent. When the subsequent steps are carried out by placing the skeletal material 4 on the surface of the thermosetting resin varnish 15 perfectly without removing the solvent, bubbles may be found in the thermosetting resin varnish 15 between the metal foil 6 and the skeletal material 4 after a B-stage is finally prepared. Consequently, when a large amount of solvent is contained, it is preferable to remove a certain amount of the solvent before the skeletal material 4 is placed on the surface of the thermosetting resin varnish 15 to prevent the bubble generation. The removal of the solvent may be carried out either by drying in the air or by heating within a temperature range equal to or lower than the curing temperature. The solvent removal level may be optionally regulated in consideration of the thickness of the thermosetting resin layer 15 and the thickness of the skeletal material 4 so that the bubble generation concerned may be avoided.

Additionally, in the case where the resin component of the thermosetting resin layer 15, before the skeletal material 4 is placed, is in a B-stage or has a very high viscosity, after the skeletal material 4 is placed on the thermosetting resin layer 15, the heated compression rolls 13 equipped are used and bonding is carried out by loading a some compression as shown in FIG. 13(C). Then, the thermosetting resin layer 15 is fluidized by heating at a temperature equal to or lower than the curing temperature of the resin component, and the thermosetting resin 15 is impregnated into the skeletal material 4 by the capillary phenomenon of the skeletal material 4 made of glass fiber or aramid fiber. Then thermosetting resin exudes to fully cover the skeletal material 4 in contact with the thermosetting resin layer 15 as shown in FIG. 13(D) And the product thus obtained is cooled to room temperature to get the skeletal material reinforced resin coated metal surface 9 shown in FIG. 13(E).

Thickness of the thermosetting resin layer 15 in this method is preferably in a range from X−30 (micron m) to X−3 (micron m) in relation to the insulating layer thickness X (micron m) to be formed. For example, to form the insulating layer thickness of 100 micron m, thickness of the thermosetting resin layer 15 formed on the surface of the metal foil should be in a range from 100−30=70 micron m to 100−3=97 micron m. In this way, it makes possible to form insulating layer in a target thickness on the surface of the metal foil 2. When the thickness of the thermosetting resin layer 15 is less than X−30 (micron m), sufficient bond strength between the insulating layer and the metal foil cannot be obtained. While, even when the thickness of the thermosetting resin layer 15 exceeds X−3 (micron m), bond strength between the insulating layer and the metal foil is not further increased. It is to be noted that the resin thickness as referred to here mean the thickness on a plain assumed to be perfectly flat.

As for the other items such as metal foil, non-woven paper or woven cloth and thermosetting resin involved are the same as in the manufacturing methods described above, the same material sand conditions described above can be adopted, so its repetitions will be omitted here.

Steps for Etching the Outer Layer Circuits:

To get the MLB shown in FIG. 1, one of the present inventions, multi-layered metal clad laminates M1, M2 and M3 are processed as following. An etching resist layer is formed on the surface of the outer layer metal foil 6. Then etching pattern of the outer layer circuit is exposed followed by developing, etching, releasing of the etching resist, cleaning and drying. In this case, the type of the etching resist and the etching conditions are not particularly limited and traditional process can be used.

EXAMPLE 1

(Preparation of a Primer Resin Sheet with a Carrier Film)

Polyethylene terephthalate (PET) film was used as a carrier film, and the primer resin layer was formed on one surface to get the primer resin sheet with a carrier film 2 in example 1.

First, a varnish for constituting the primer resin sheet was prepared. A raw material used was a solvent-soluble aromatic polyamide resin polymer dissolved in cyclopentanone (BP3225-50P, manufactured by Nippon Kayaku Co., Ltd.) and an o-cresol novolac epoxy resin (YDCN-704, manufactured by Tohto Kasei Co., Ltd.). To this mixed varnish, a phenolic resin to be used as a curing agent (VH-4170 manufactured by Dainippon Ink and Chemicals, Inc.) and curing accelerator (2E4MZ manufactured by Shikoku Corp.) were added to finish a resin mixture having the blending ratios shown below.

Resin formulation:

| | |
|---|---|
| O-Cresol novolac epoxy resin | 38 parts by weight |
| Aromatic polyamide resin polymer | 50 parts by weight |
| Phenolic resin | 18 parts by weight |
| Curing accelerator | 0.1 part by weight |

The resin mixture is dissolved in methyl ethyl ketone to have a solid content of 30 wt % to prepare a varnish.

The varnish prepared as described above was coated onto the PET film by use of a gravure coater. Then, drying for 5 minutes in the air followed by curing for 3 minutes at 140 deg. C., to form a 1.5 micron m thick primer resin film in a B-stage, and thus a primer resin sheet with a carrier film 2 was obtained.

For resin flow measurement on the resin obtained, a resin coated metal foil with 40 micron m thick layer of the resin used for forming the primer resin sheet was prepared. Additionally, four 10 cm square samples were cut from this resin flow measurement sample, and the resin flow measurement was carried out according to MIL-P-13949G specification. Consequently, resin flow show 1.5%.

(Preparation of Inner Layer Circuit Boards)

A 100 micron m thick FR-4 double-sided CCL with 18 micron m thick electro-deposited copper foil on both sides was prepared. An etching resist layer (a dry film was used) was provided on each of both copper foil layers of the double-sided CCL. Then etching pattern of the inner layer circuit is exposed followed by developing, etching, releasing of the etching resist, cleaning and drying to get an inner layer circuit board IB as shown in FIG. 3(2). The inner layer circuit board IB at this stage is free from any silane coupling agent treatment or any surface treatment. This inner layer circuit board IB is referred to as "the first inner layer circuit board."

Then, the first inner layer circuit board IB was dipped in 150 g/l sulfuric acid at a solution temperature of 30 deg. C. for 30 seconds for cleaning, degrease and remove the oxide layer on the surface, and was washed with water. Thereafter, without drying the surface of the inner layer circuit board IB, the board IB was dipped for adsorption treatment in an aqueous solution 5 g/l g-glycidoxypropyltrimethoxysilane with de-ionized water. Then, the board IB was heated for 4 seconds in an electric furnace at 180 deg. C. to dry the water and perform the condensation reaction of the silane coupling agent. Thus silane coupling agent layers were formed. The inner layer circuit board IB thus obtained is referred to as "the second inner layer circuit board."

In addition, four inner layer circuit boards are prepared as following.

"the third inner layer circuit board": electro-deposited tin thereon.

"the fourth inner layer circuit board": electro-deposited nickel thereon.

"the fifth inner layer circuit board": electro-deposited tin-lead alloy thereon.

"the sixth inner layer circuit board": electro-deposited nickel-zinc alloy thereon.

The surface layer treated with tin was formed by electro-plating using stannous sulfate bath under the conditions that a tin concentration of 20 g/l, the solution temperature was 30 deg. C., the pH was 3, and the current density was 5 A/dsq.-m. Tin layer on each of the surfaces of the inner layer circuits were even and smooth with 1 micron m thick.

The surface layer treated with nickel was formed by elec-troplating using nickel sulfate bath under the conditions that a nickel concentration of 20 g/l, the solution temperature was 40 deg. C., the pH was 3, and the current density was 10 A/d-sq.-m. Nickel layer on each of the surfaces of the inner layer circuits were even and smooth with 1 micron m thick.

The surface layer treated with tin-lead alloy was formed by electroplating using bath with stannous sulfate (30 g/l), lead acetate (20 g/l), sodium pyrophosphate (150 g/l), di-sodium EDTA (20 g/l), PEG-3000 (1.2 g/l) and a 37% aqueous solu-tion of formalin (0.7 ml/l), under the conditions that the solution temperature was 50 deg. C., the pH was 9, and the current density was 12 A/d-sq.-m. Tin-lead alloy layer on each of the surfaces of the inner layer circuits were even and smooth with 1 micron m thick.

The surface layer treated with nickel-zinc alloy was formed by electroplating using bath with nickel by nickel-sulfate (2.0 g/l), zinc by zinc pyrophosphate (0.5 g/l), potassium pyro-phosphate (250 g/l), and under the conditions that the solution temperature was 35 deg. C., the pH was 10, and the current density was 5 A/d-sq.-m. Nickel-zinc alloy layer on each of the surfaces of the inner layer circuits were even and smooth with 1 micron m thick.

In addition, a silane coupling agent layer was formed on the surface of each of the third to sixth inner layer circuit boards under the above described conditions for forming the silane coupling agent layer, to get the seventh to tenth inner layer circuit boards, respectively.

(Placing of Primer Resin Sheets)

In this steps, as shown in FIGS. 3(2) to 3(4), the primer resin surface of the primer resin sheet with a carrier film 2 was superposed against each of the above described inner layer circuit boards IB, and then the carrier film F was removed. In this way, each of the inner layer circuit boards IB was made to be a state in which the primer resin sheet 3 was placed on each of both surfaces of the boards IB, as shown in FIG. 3(4).

(Preparation of a Multi-Layered CCL)

Multi-layered CCL M1 was prepared according to the pro-cedures shown in FIGS. 5(5) to 5(7). So, an 18 micron m thick electro-deposited copper foil was used as the metal foil 6, and a 50 micron m thick FR-4 pre-preg 5 was used as shown in FIG. 5(5). They are superposed on the primer resin sheets 3 situated on both surfaces of the inner layer circuit board IB, as shown in FIG. 5(6). Then, by hot pressing with conditions of temperature 180 deg. C., pressure 20 kg/sq.-cm and the curing time 90 minutes, the multi-layered CCL M1 having a sche-matic sectional view shown in FIG. 5(7) was obtained.

(Preparation of a MLB)

Etching resist layer (a dry film was used) was provided on the surface of the metal foil 6 (an outer layer copper foil) on each of both surfaces of the multi-layered CCL M1, and then the etching pattern of the outer layer circuit was exposed followed by development, circuit etching, releasing of the etching resist, cleaning and drying to get a MLB 1 like shown in FIG. 1. FIG. 2 shows an optical microscopic photograph of the cross sectional view of the inner layer circuit of this board, the thin primer resin layer P being clearly observed to coat the periphery of the inner layer circuit Ci.

(Performance Evaluation of a MLB)

The MLB 1 obtained as described above was subjected to a thermal shock test. In which, the boards were dipped into a solder bath at 260 deg. C. for 3 seconds followed by transfer with 10 seconds, dipping into a silicon oil at room tempera-ture for 20 seconds, and then a visual inspection for blistering was carried out on the boards.

Figure 14:
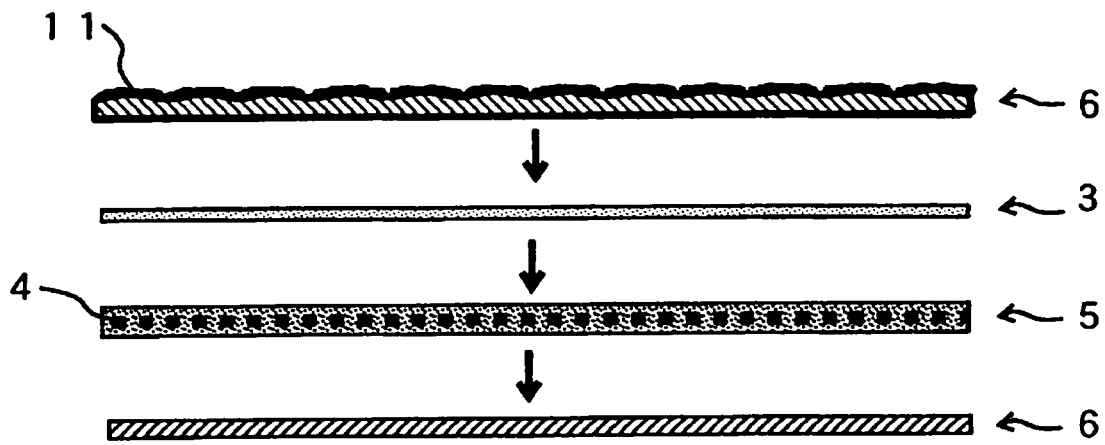
FIG. 14 is schematic views it shows the procedures for preparing a specimen to be used in a peel strength measurement.
Figure 14:
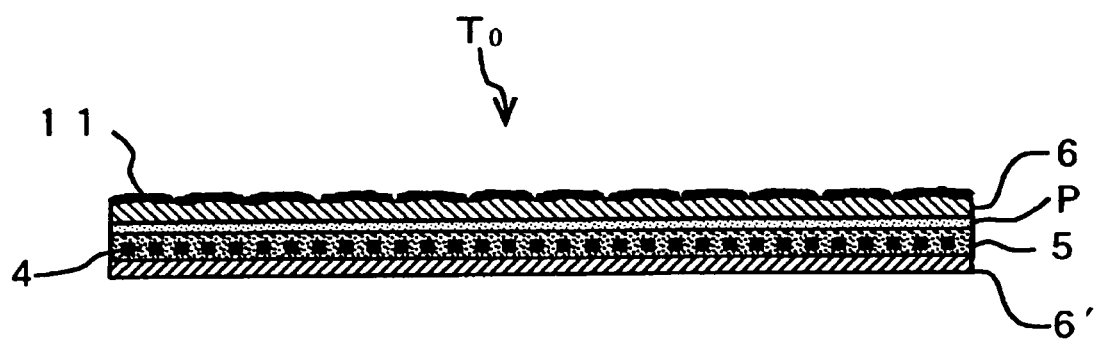
Figure 14:
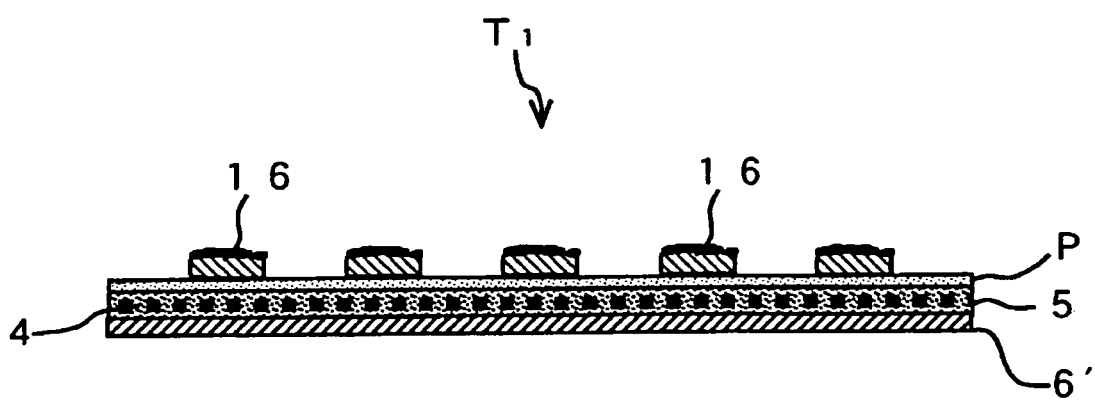

Because measurement of the peel strength of the inner layer circuits Ci directly is difficult, the following alternative method was adopted to monitor peel strength of the inner layer circuits Ci. More specifically, as shown in FIG. 14(1), a 50 micron m thick pre-preg 5 on a copper foil 6', a primer resin sheet 3 without carrier film 2 on the pre-preg 5, an electro-deposited copper foil 6, obtained from the same lot as that for the copper foil used in forming the inner layer circuit, on the primer resin sheet 3 to face shiny side to the primer resin sheet 3, and then hot pressing was carried out to prepare a CCL T0 shown in FIG. 14(2). Then, to prepare a sample T1 for peel strength measurement shown in FIG. 14(3), an etching resist layer (a dry film was used) was provided on the roughened surface 11 of the electro-deposited copper foil 6, etching pattern of 0.2 mm wide straight line circuits 16 for peel strength measurement were exposed followed by develop-ment, circuit etching, releasing of the etching resist, cleaning and drying.

The result on the thermal shock test and the peel strength measurement are shown in Table 1 with Comparative Examples. In Table 1, Samples 1-1 to 1-10 represents a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 1

| | | Inner layer circuit board | | | |
|---|---|---|---|---|---|
| Example | No. | Silane layer | Surface treatment | Thermal shock test | Peel strength kgf/cm |
| Example | 1 | None | None | Pass | 0.86 |
| | 2 | Formed | | | 1.10 |
| | 3 | None | Sn | | 1.35 |
| | 4 | | Ni | | 1.26 |
| | 5 | | Sn—Pb | | 1.37 |
| | 6 | | Ni—Zn | | 1.28 |
| | 7 | Formed | Sn | | 1.48 |
| | 8 | Formed | Ni | | 1.32 |
| | 9 | Formed | Sn—Pb | | 1.49 |
| | 10 | Formed | Ni—Zn | | 1.40 |
| Comp. | 1 | None | None | N.G. | 0.21 |

TABLE 1-continued

| | | | Inner layer circuit board | | |
|---|---|---|---|---|---|
| Example | No. | Silane layer | Surface treatment | Thermal shock test | Peel strength kgf/cm |
| Example | 2 | | | | 0.10 |
| | 3 | | | | 0.14 |
| | 4 | Formed | | | 0.32 |

EXAMPLE 2

(Preparation of a Primer Resin Sheet with a Carrier Film)

The primer resin sheet with a carrier film 2 used was as same as in EXAMPLE 1. So, the description thereof will be omitted to avoid its repetition.

(Preparation of a Resin Coated Copper Foil)

Here, a resin coated copper foil 7 was obtained by coating the varnish which is prepared in a resin formulation using the components a to c described below, on the roughened surface of an 18 micron m thick electro-deposited copper foil. An epoxy resin, a bisphenol-A epoxy resin (brand name: EPOMIK R-140, manufactured by Mitsui Chemicals, Inc.) was used as component a. An epoxy resin having glycidyl functional as R (brand name: NC-3000P, manufactured by Nippon Kayaku Co., Ltd.) was used as component b. The components a and b were mixed together in a weight ratio of 40:60.

Di-cyan-diamide 25% solution in di-methyl-formamide was added to the above epoxy resins in a content of 6 parts by weight in terms of di-cyan-diamide as the epoxy resin curing agent, and an epoxy resin curing accelerator (brand name: Cresol 2P4MZ, manufactured by Shikoku Corp.) was added in a content of 1 part by weight. The mixture thus obtained was dissolved in di-methyl-formamide to get a solution having a solid content of 50 wt % (the solution obtained at this stage will be referred to as "the epoxy resin blend").

Then, a poly-vinyl-acetal resin (brand name: Denka Butyral 5000A, manufactured by Denki Kagaku Kogyo KK) as a polymer having in the molecule thereof functional groups capable of cross-linking, and a urethane resin (brand name: Coronate AP stable, manufactured by Nippon Polyurethane Industry Co., Ltd.) as a cross-linking agent were added as the component c.

The varnish of total solid content 30 wt % with resin formulation such that the epoxy resin 80 parts by weight (in terms of the solid content), the polyvinyl acetal resin 17 parts by weight and the urethane resin 3 parts by weight by using a 1:1 mixed solvent of toluene and methanol.

This varnish was coated on to the roughened surface of an electro-deposited copper foil having a nominal thickness of 18 micron m, dried in the air, and heated at 130 deg. C. for 5 minutes to get a resin coated copper foil 7 with a resin in a B-stage.

(Preparation of Inner Layer Circuit Boards)

The first to tenth inner layer circuit boards IB same as in EXAMPLE 1 were used, so the description thereof will be omitted to avoid its repetition.

(Lamination of Primer Resin Sheets)

In this step, the primer resin sheet 3 was placed on both surfaces of the inner layer circuit boards IB in the same manner as in EXAMPLE 1, resulting in a state shown in FIG. 3(4).

(Preparation of a Multi-Layered CCL)

In this EXAMPLE, according to the procedures shown in FIGS. 7(5) to 7(7), the multi-layered CCL M2 was prepared. So, as shown in FIG. 7(5), by use of the above described resin coated copper foil 7, the resin surface of the resin coated copper foil 7 was superposed on the primer resin sheet 3 on both surfaces of the inner layer circuit board IB, resulting in a state shown in FIG. 7(6). Then, by hot pressing, the multi-layered CCL M2 having a schematic sectional view shown in FIG. 7(7) was obtained.

(Preparation of a MLB)

Figure 18:
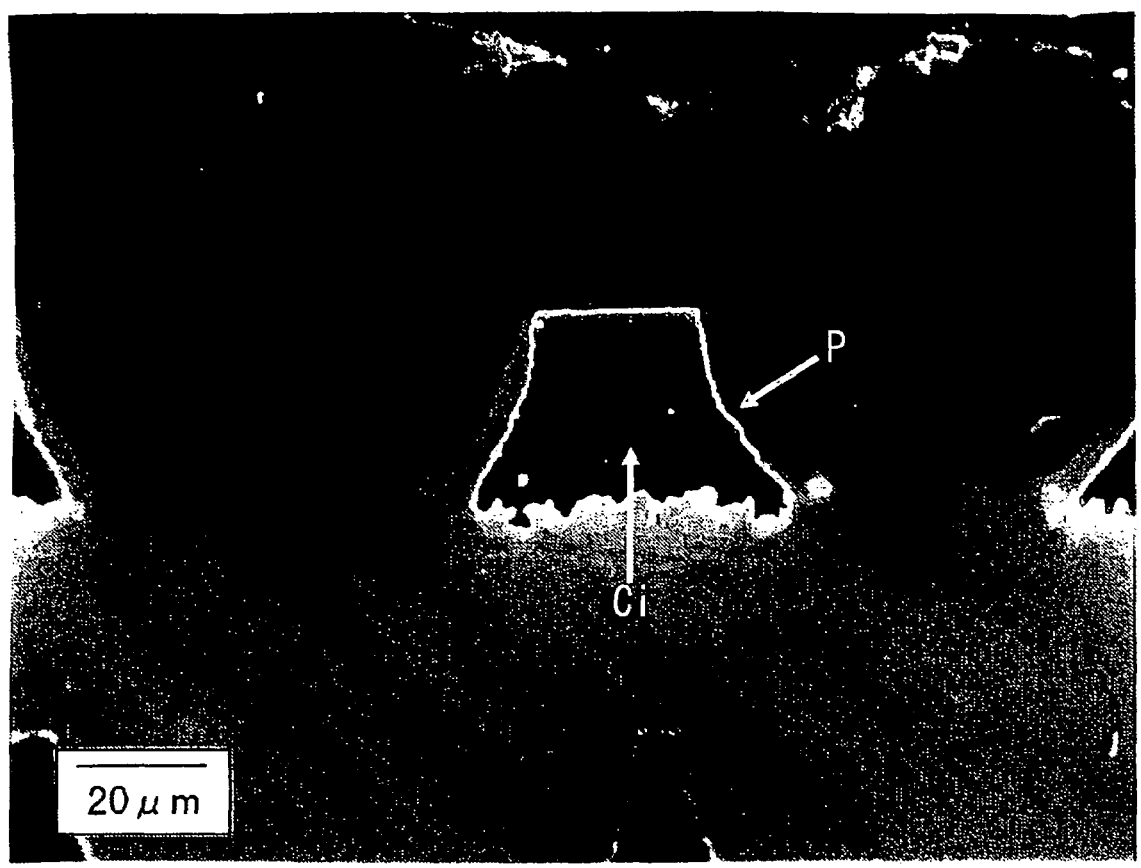
FIG. 18 is an optical microscopic photograph of the cross sectional view of an inner layer circuit of the MLB of the present invention.

Next, an etching resist layer (a dry film was used) was provided on the surface of the metal foil 6 (an outer layer copper foil) on both surfaces of the multi-layered CCL M2. Then, the etching pattern of the outer layer circuit was exposed followed by development, circuit etching, releasing of the etching resist, cleaning and drying to get a MLB 1 like shown in FIG. 1. FIG. 18 is an optical microscopic photograph of the cross sectional view of the inner layer circuit of this board, the thin primer resin layer P is clearly observed to evenly coat the periphery of the inner layer circuit Ci.

(Performance Evaluation of a MLB)

The MLB 1 obtained as described above were subjected to the thermal shock test and the peel strength measurement in the same procedure as in EXAMPLE 1, and the results obtained are shown in Table 2 with Comparative Examples. In Table 2, MLB samples 2-1 to 2-10 are prepared by using the first to tenth inner layer circuit boards, respectively.

Because measurement of the peel strength of the inner layer circuits Ci directly is difficult, the following alternative method was adopted to monitor peel strength of the inner layer circuits Ci. More specifically, as shown in FIG. 14(1), a 50 micron m thick pre-preg 5 on a copper foil 6', a primer resin sheet 3 without carrier film 2 on the pre-preg 5, an electro-deposited copper foil 6, obtained from the same lot as that for the copper foil used in forming the inner-layer circuit, on the primer resin sheet 3 to face shiny side to the primer resin sheet 3, and then hot pressing was carried out to prepare a CCL TO shown in FIG. 15(2). Then, a sample T1 for peel strength measurement shown in FIG. 15(3) was prepared in the same manner as in EXAMPLE 1.

The results on the thermal shock test and the peel strength measurement are shown in Table 2 with Comparative Examples. In Table 2, Samples 2-1 to 2-10 represent a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 2

| | | Inner layer circuit board | | | |
|---|---|---|---|---|---|
| Example | No. | Silane layer | Surface treatment | Thermal shock test | Peel strength kgf/cm |
| Example | 1 | None | None | Pass | 0.82 |
| | 2 | Formed | | | 1.13 |
| | 3 | None | Sn | | 1.22 |
| | 4 | | Ni | | 1.26 |
| | 5 | | Sn—Pb | | 1.30 |
| | 6 | | Ni—Zn | | 1.29 |
| | 7 | Formed | Sn | | 1.39 |
| | 8 | Formed | Ni | | 1.35 |
| | 9 | Formed | Sn—Pb | | 1.43 |
| | 10 | Formed | Ni—Zn | | 1.41 |

TABLE 2-continued

| | | | Inner layer circuit board | | |
|---|---|---|---|---|---|
| Example | No. | Silane layer | Surface treatment | Thermal shock test | Peel strength kgf/cm |
| Comp. Example | 1 | None | None | N.G. | 0.21 |
| | 2 | | | | 0.10 |
| | 3 | | | | 0.14 |
| | 4 | Formed | | | 0.32 |

EXAMPLE 3

(Preparation of a Primer Resin Sheet with a Carrier Film)

The primer resin sheet with a carrier film 2 used was as same as in EXAMPLE 1. So, description thereof will be omitted to avoid its repetition.

(Preparation of a Skeletal Material Reinforced Resin Coated Copper Foil)

First, the epoxy resin composition to be used for forming the first thermosetting resin layer 12 and the second thermosetting resin layer 14 was prepared. In this case, 30 parts by weight of a bisphenol-A epoxy resin (brand name: YD-128, manufactured by Tohto Kasei Co., Ltd.) and 50 parts by weight of an o-cresol epoxy resin (brand name: ESCN-195XL80, manufactured by Sumitomo Chemical Corp.). In addition, 16 parts by weight of di-cyan-diamide (4 parts by weight as di-cyan-diamide) having a solid content of 25% in a di-methyl-formaldehyde solution as a epoxy resin curing agent and 0.1 part by weight of 2-ethyl-4-methyl-imidazole (brand name: Cresol 2E4MZ, manufactured by Shikoku Corp.) as a curing accelerator were dissolved in a mixed solvent composed of methyl ethyl ketone and di-methyl-formaldehyde (mixing ratio: methyl ethyl ketone/di-methyl-formaldehyde=4/6) to get the epoxy resin formulation having a solid content of 60 wt %.

This epoxy resin composition was evenly coated onto the roughened surface 11 of the electro-deposited copper foil 6 having a nominal thickness of 18 micron m as shown in FIG. 12(B), kept at room temperature for 30 minutes to remove a certain amount of the solvent, and heated at 150 deg. C. for 2 minutes in a hot air oven, and thus the first thermosetting resin layer 12 was cured into a B-stage. In this case, the coated epoxy resin composition had the resin thickness 40 micron m after drying.

Next, a non-woven paper made of aramid fiber having a nominal thickness of 50 micron m was bonded as the skeletal material 4 onto the first thermosetting resin layer 12 as shown in FIG. 12(c). This bonding was carried out in such a way that the non-woven paper was superposed on the surface of the first thermosetting resin layer 12 and pass at a speed of 20 cm/min between the heating rolls 13 at 150 deg. C. and gave pressure of 9 kg/sq.-cm. Consequently, the total thickness of the first thermosetting resin layer 12 with the skeletal material 4 show 55 micron m on average in a bonded state.

After finishing bonding of the skeletal material 4 as described above, the second thermosetting resin layer 14 was formed as shown in FIG. 12(D). The epoxy resin composition used for forming the second thermosetting resin layer 14 was the same as that used for forming the first thermosetting resin layer 12. So, the description of the epoxy resin composition will be omitted to avoid its repetition.

To form a second thermosetting resin layer, the epoxy resin composition was evenly coated onto the bonded skeletal material 4, kept at room temperature for 30 minutes to remove a certain amount of the solvent, and heated at 150 deg. C. for 2 minutes in a hot air oven, and thus the second thermosetting resin layer 14 was cured into a B-stage. In this case, the applied amount of the epoxy resin was such that the total thickness of the first thermosetting resin layer 12, the skeletal material 4, and the second thermosetting resin layer 14 after curing was 75 micron m. As described above, a skeletal material reinforced resin coated copper foil 9 was prepared by the manufacturing method of the present invention.

(Preparation of Inner Layer Circuit Boards)

The first to tenth inner layer circuit boards IB same as in EXAMPLE 1 were used, so the description thereof will be omitted to avoid its repetition.

(Lamination of Primer Resin Sheets)

In this step, the primer resin sheet 3 was placed on both surfaces of the inner layer circuit boards IB in the same manner as in EXAMPLE 1, resulting in a state shown in FIG. 3(4).

(Preparation of a Multi-Layered CCL)

In this EXAMPLE, according to the procedures shown in FIG. 9, the multi-layered CCL M3 was prepared. So, as shown in FIG. 9(5), by use of the above described skeletal material reinforced resin coated copper foil 9, the skeletal material reinforced resin surface of the skeletal material reinforced resin coated copper foil 9 was superposed on the primer resin sheet 3 of both surfaces of the inner layer circuit board IB. Then, by hot pressing in a state shown in FIG. 9(6), the multi-layered CCL M3 having a schematic sectional view shown in FIG. 9(7) was obtained.

(Preparation of a MLB)

Figure 22:
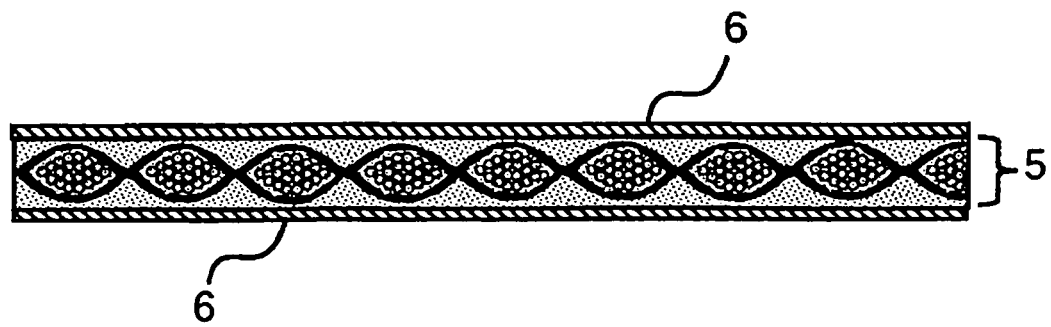
FIG. 22 is schematic views it shows the manufacturing steps of a conventional MLB.
Figure 22:
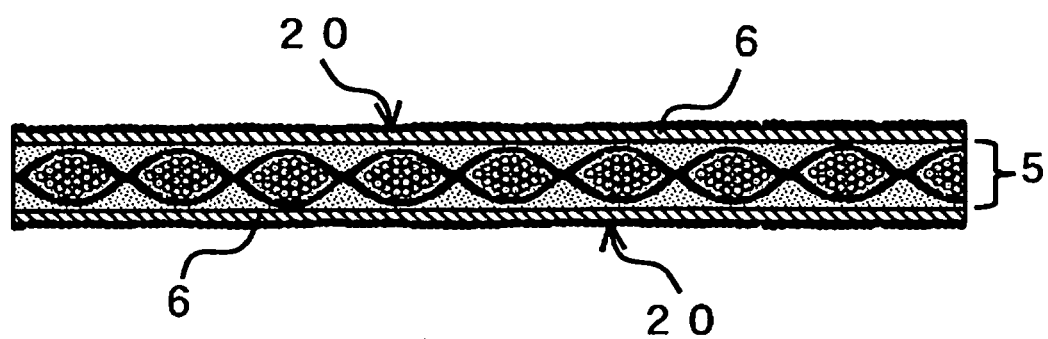
Figure 22:
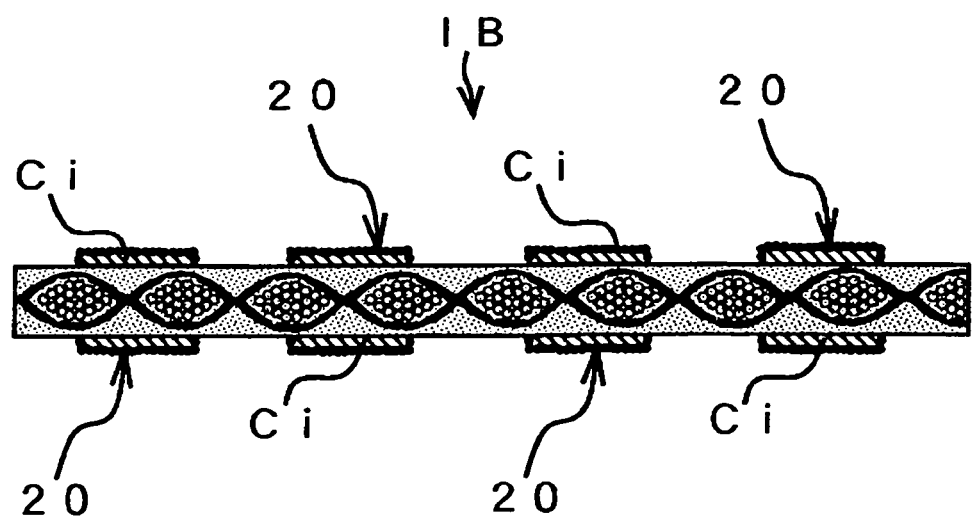
Figure 23:
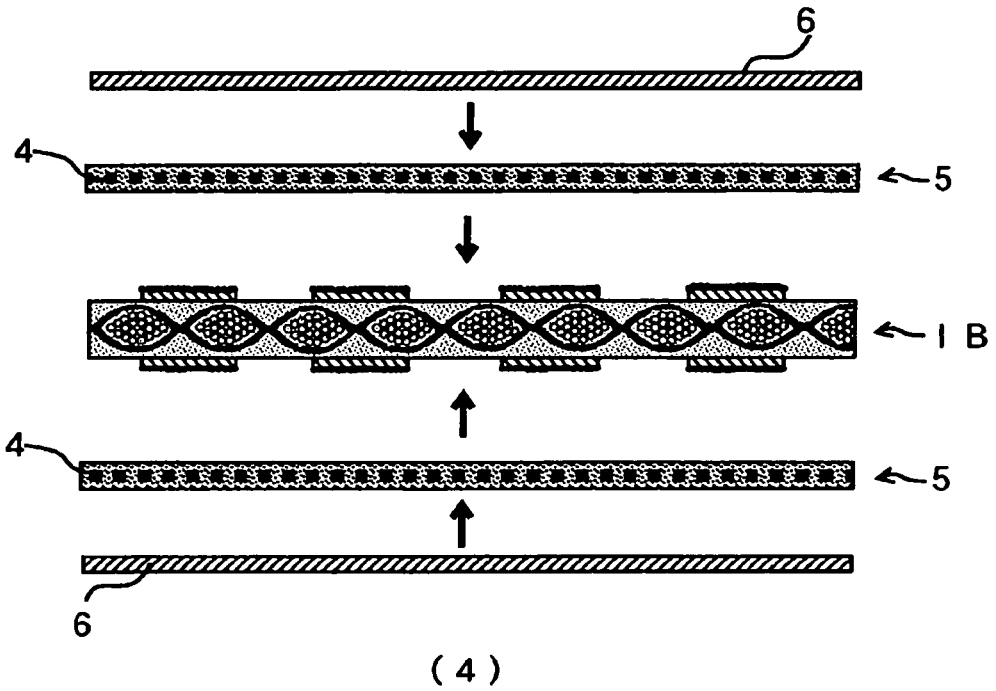
FIG. 23 is schematic views it shows the manufacturing steps of a conventional MLB.
Figure 23:
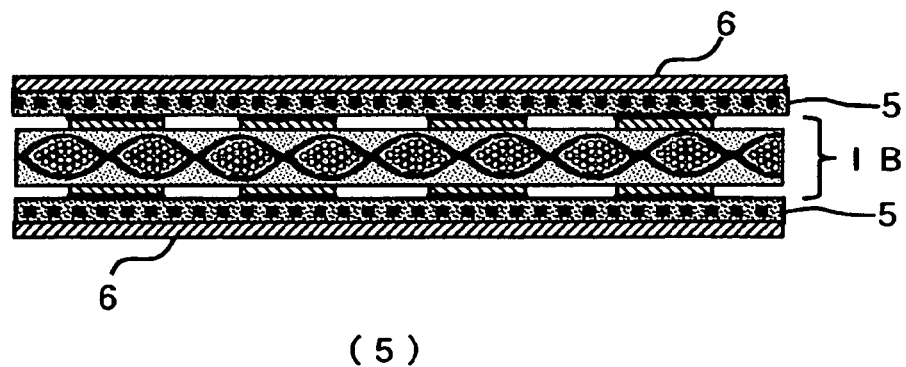
Figure 23:
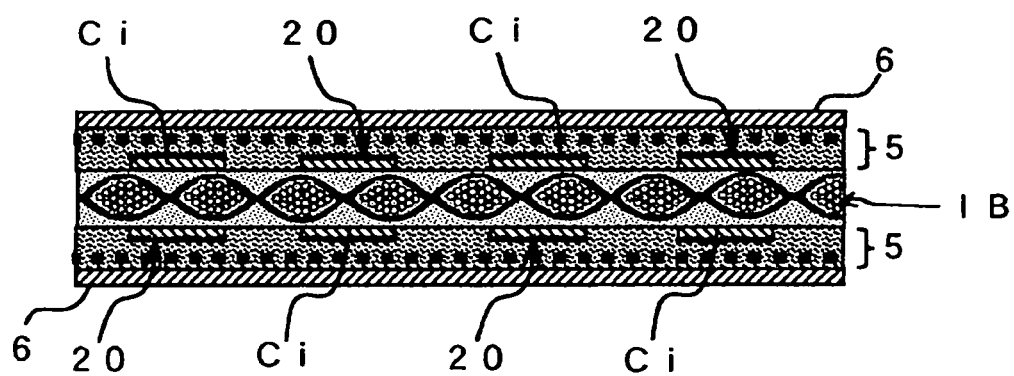

Next, an etching resist layer (a dry film was used) was provided on the surface of the metal foil 6 (an outer layer copper foil) on both surfaces of the multi-layered CCL M3. Then, the etching pattern of the outer layer circuit was exposed followed by development, circuit etching, releasing of the etching resist, cleaning and drying to get a MLB 1 like shown in FIG. 1. FIG. 22 is an optical microscopic photograph of the cross sectional view of the inner layer circuit of this board, the thin primer resin layer P is clearly observed to evenly coat the periphery of the inner layer circuit Ci.

(Performance Evaluation of a MLB)

Figure 15:
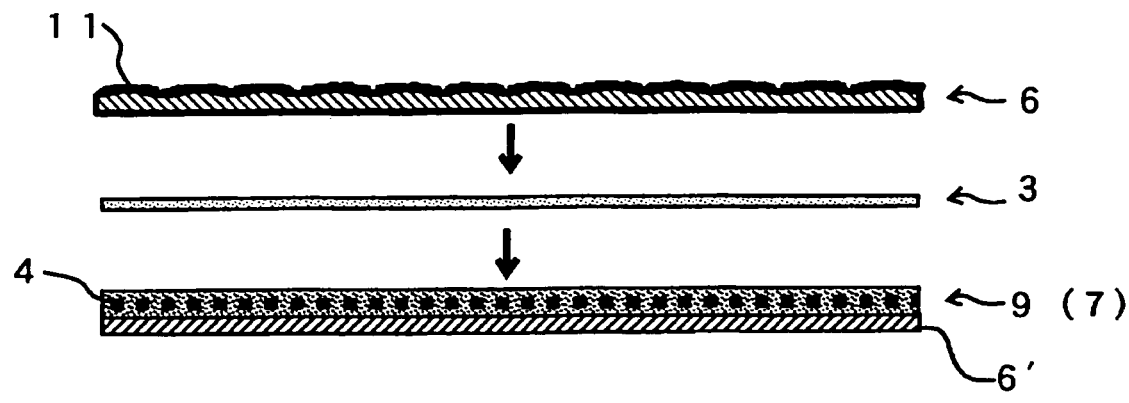
FIG. 15 is schematic views it shows the procedures for preparing a specimen to be used in a peel strength measurement.
Figure 15:
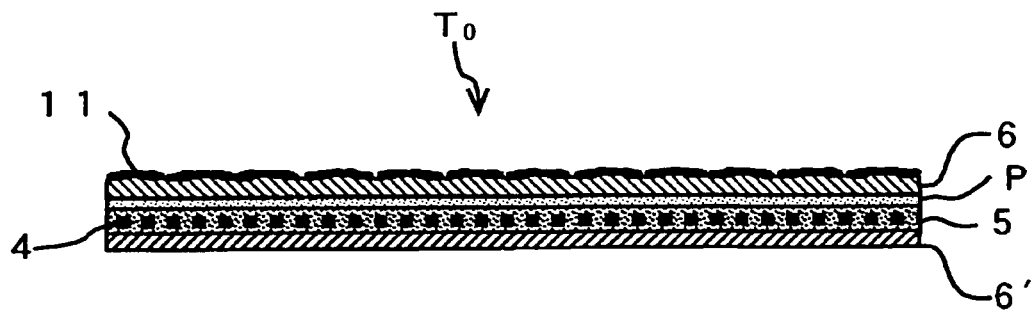
Figure 15:
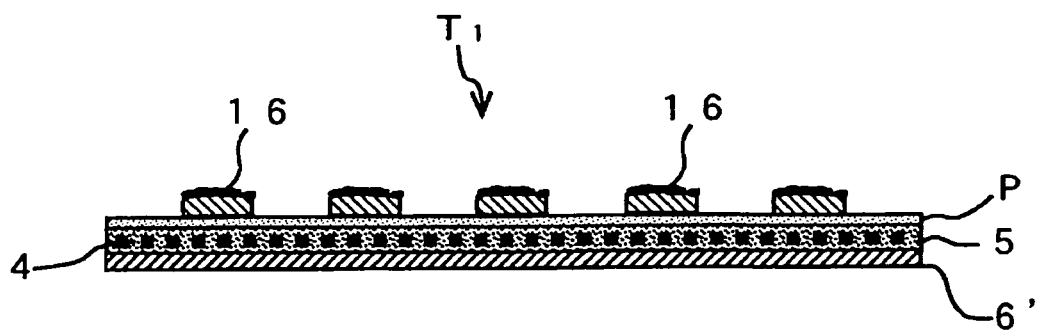

The MLB 1 obtained as described above were subjected to the thermal shock test and the peel strength measurement in the same manner as in EXAMPLE 1, and the results obtained are shown in Table 3 with Comparative Examples. In Table 3, Samples 3-1 to 3-10 represent a MLB prepared by using the first to tenth inner layer circuit boards. Because direct measurement of the peel strength of the inner circuit layer Ci was difficult, a CCL T0 which was the same as shown in FIG. 15(2) was prepared in the same manner as shown in FIG. 15. Then, a sample T1 for peel strength measurement shown in FIG. 15(3) was prepared in the same manner as in EXAMPLE 1.

The results on the thermal shock test and the peel strength measurement are shown in Table 3 with Comparative Examples. In Table 3, Samples 3-1 to 3-10 represent a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 3

| Example | No. | Silane layer | Surface treatment | Thermal shock test | Peel strength kgf/cm |
|---|---|---|---|---|---|
| Example | 1 | None | None | Pass | 0.83 |
|  | 2 | Formed |  |  | 1.05 |
|  | 3 | None | Sn |  | 1.18 |
|  | 4 |  | Ni |  | 1.20 |
|  | 5 |  | Sn—Pb |  | 1.33 |
|  | 6 |  | Ni—Zn |  | 1.30 |
|  | 7 | Formed | Sn |  | 1.37 |
|  | 8 | Formed | Ni |  | 1.40 |
|  | 9 | Formed | Sn—Pb |  | 1.43 |
|  | 10 | Formed | Ni—Zn |  | 1.40 |
| Comp. Example | 1 | None | None | N.G. | 0.21 |
|  | 2 |  |  |  | 0.10 |
|  | 3 |  |  |  | 0.14 |
|  | 4 | Formed |  |  | 0.32 |

EXAMPLE 4

In this EXAMPLE, a primer resin layer was formed by coating on the surface of an inner circuit board, then a multi-layered CCL was prepared by use of the inner layer circuit boards, and a MLB was prepared by use of the multi-layered CCL.

(Preparation of Inner Layer Circuit Boards)

In the same manner as in EXAMPLE 1, a 100 micron m thick FR-4 double-sided CCL with 18 micron m thick electro-deposited copper foil on both sides was prepared. An etching resist layer (a dry film was used) was provided on each of both copper foil layered of the double-sided CCL. Then etching pattern of the inner layer circuit is exposed followed by developing, etching, releasing of the etching resist, cleaning and drying to get an inner layer circuit board IB as shown in FIG. 3(2).

Then, "the first inner layer circuit board" to "the tenth inner layer circuit board" which were the same as those in EXAMPLE 1 were prepared. The process conditions and the like are the same as in EXAMPLE 1, so the description thereof will be omitted here to avoid its repetition.

(Coating of the Inner Layer Circuit Boards with a Varnish)

As a raw material, a solvent-soluble aromatic polyamide resin polymer (BP3225-50P: manufactured by Nippon Kayaku Co., Ltd. commercially available as a mixed varnish in cyclopentanone) and an o-cresol novolac epoxy resin (YDCN-704, manufactured by Tohto Kasei Co., Ltd.) were used. In addition, a curing agent (VH-4170, phenolic resin manufactured by Dainippon Ink and Chemicals Inc.), and a curing accelerator (2E4MZ, manufactured by Shikoku Corp.) were added to prepare a varnish having the blending ratios as same as in EXAMPLE 1. So, the description thereof is omitted here. For the purpose of obtaining a varnish for coating, methyl ethyl ketone was added to the resin mixture to get a varnish to have a solid content of 12 wt %.

The above described inner layer circuit boards were dipped in the varnish prepared as described above, as the image shown in FIG. 4(A), and then taken out to form a varnish coating on both surfaces of the inner layer circuit boards. Then, dried for 5 minutes in the air, and then heated at 140 deg. C. for 5 minutes to form a 1.3 micron m thick primer resin layer in a B-stage on the surfaces of the inner layer circuit boards.

The varnish obtained in this case was for use in coating and very easy to flow, so a special method was applied for resin flow measurement. To prepare sample for the resin flow measurement, coating of the varnish onto one surface of a copper foil followed by curing was repeated until the thickness of the formed resin film reached 40 micron m. Additionally, from this resin flow measurement sample, four 10 cm square samples were cut, and the resin flow measurement was carried out in conformity with above described MIL-P-13949G specification. Consequently, the resin flow was 1.2%.

(Preparation of a Multi-Layered CCL)

In this EXAMPLE, according to the procedures shown in FIG. 6, the multi-layered CCL M1 was prepared. So, an 18 micron m thick electro-deposited copper foil as the metal foil 6 was placed on a 50 micron m thick FR-4 grade pre-preg 5 on the primer resin sheets 17 on both surfaces of the inner layer circuit board IB, as shown in FIG. 6(a). Then, by hot pressing, the multi-layered CCL M1 having a schematic sectional view shown in FIG. 6(b) was obtained. In this case, the pressing conditions were such that temperature 180 deg. C., pressure 20 kg/sq.-cm with curing time 90 minutes.

(Preparation of a MLB)

Next, an etching resist layer (a dry film was used) was provided on the surface of the metal foil 6 (an outer layer copper foil) on both surfaces of the multi-layered CCL M2. Then, the etching pattern of the outer layer circuit was exposed followed by development, circuit etching, releasing of the etching resist, cleaning and drying to get a MLB 1 like shown in FIG. 1. FIG. 18 is an optical microscopic photograph of the cross sectional view of the inner layer circuit of this board, the thin primer resin layer P is clearly observed to evenly coat the periphery of the inner layer circuit Ci.

(Performance Evaluation of a MLB)

The MLB 1 obtained as described above were subjected to the thermal shock test and the peel strength measurement in the same manner as in EXAMPLE 1, and the results obtained are shown in Table 4 with Comparative Examples. In Table 4, Samples 4-1 to 4-10 represent a MLB prepared by using the first to tenth inner layer circuit boards.

Figure 16:
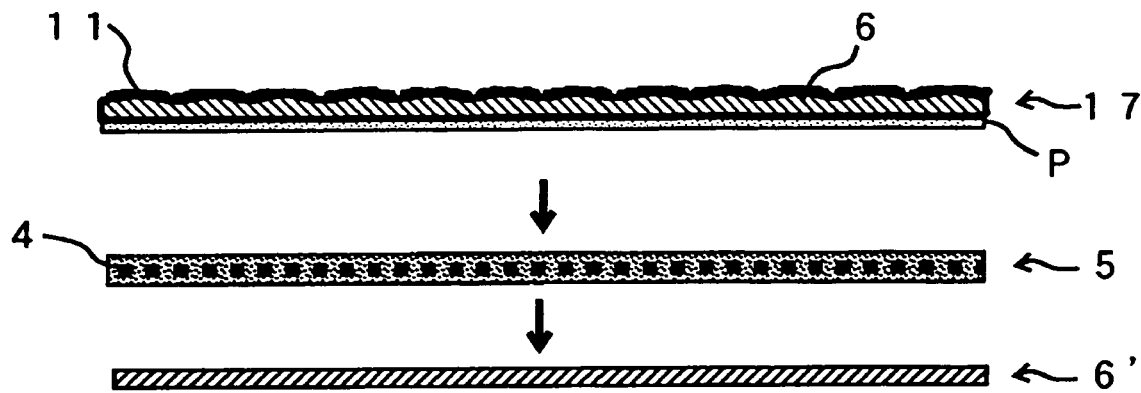
FIG. 16 is schematic views it shows the procedures for preparing a specimen to be used in a peel strength measurement.
Figure 16:
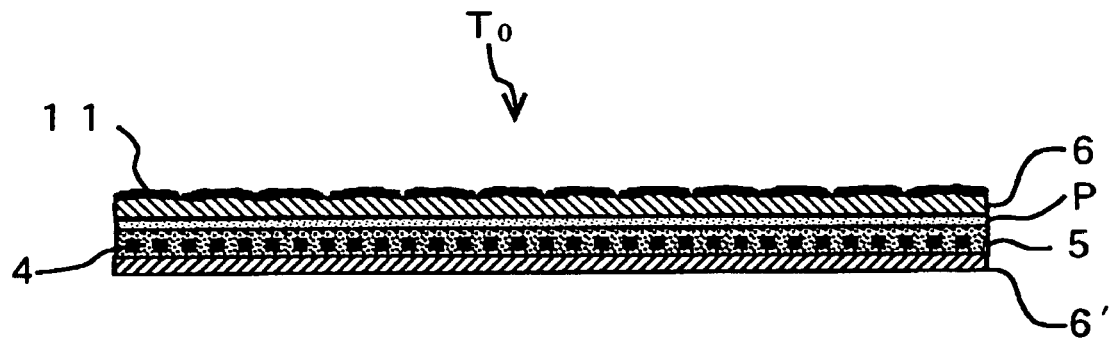
Figure 16:
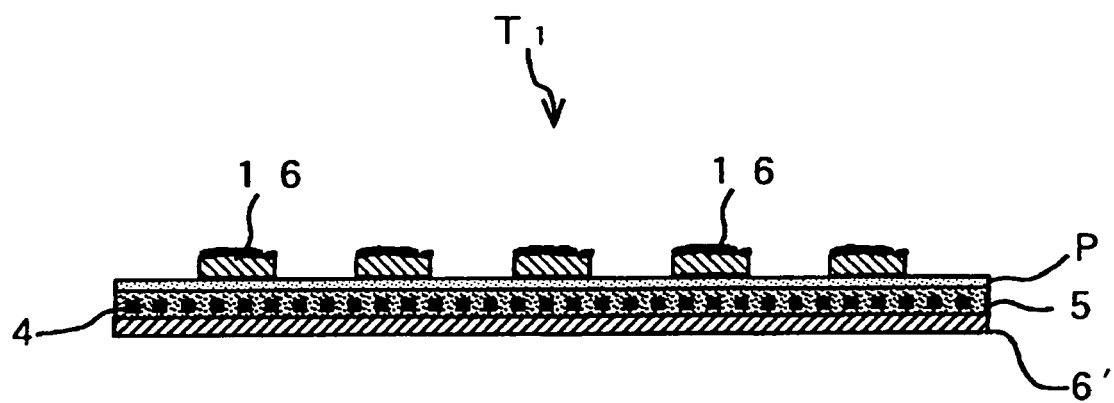

Because measurement of the peel strength of the inner layer circuits Ci directly is difficult, the following alternative method was adopted to monitor peel strength of the inner layer circuits Ci. More specifically, to prepare resin coated copper foil samples shown in FIG. 16(1) for measurement, about 1.3 micron m thick primer resin layer P was formed on shiny side of electro-deposited copper foil 6, same lot used for preparing inner layer circuit boards. To prepare a CCL TO shown in FIG. 16(2), A 50 micron m thick pre-preg was superposed on a copper foil 6' as shown in FIG. 16(1) and the resin coated copper foil to be tested 17 was superposed on the pre-preg 5 so that primer resin layer P of the resin coated copper foil to be tested 17 abuts on the pre-preg 5, and then the book was hot-pressed. Then, to prepare a sample T1 for peel strength measurement shown in FIG. 16(3), an etching resist layer (a dry film was used) was provided on the roughened surface 11 of the electro-deposited copper foil 6, etching patterns of 0.2 mm wide straight line circuits 16 for peel strength measurement were exposed followed by development, circuit etching, releasing of the etching resist, cleaning and drying.

The results on the thermal shock test and the peel strength measurement are shown in Table 4 with Comparative Examples. In Table 4, Samples 4-1 to 4-10 represent a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 4

| Example | No. | Silane layer | Surface treatment | Thermal shock test | Peel strength kgf/cm |
|---|---|---|---|---|---|
| Inner layer circuit board | | | | | |
| Example | 1 | None | None | Pass | 0.92 |
|  | 2 | Formed |  |  | 1.14 |
|  | 3 | None | Sn |  | 1.25 |
|  | 4 |  | Ni |  | 1.26 |
|  | 5 |  | Sn—Pb |  | 1.29 |
|  | 6 |  | Ni—Zn |  | 1.27 |
|  | 7 | Formed | Sn |  | 1.38 |
|  | 8 | Formed | Ni |  | 1.41 |
|  | 9 | Formed | Sn—Pb |  | 1.43 |
|  | 10 | Formed | Ni—Zn |  | 1.42 |
| Comp. Example | 1 | None | None | N.G. | 0.21 |
|  | 2 |  |  |  | 0.10 |
|  | 3 |  |  |  | 0.14 |
|  | 4 | Formed |  |  | 0.32 |

EXAMPLE 5

In this EXAMPLE, a primer resin layer was formed by coating on the surface of inner layer circuit board, then a multi-layered CCL was prepared by use of the inner layer circuit boards, and a MLB was prepared by use of the multi-layered CCL.

(Preparation of Inner Layer Circuit Boards)

In the same manner as in EXAMPLE 1, a 100 micron m thick FR-4 double-sided CCL with 18 micron m thick electro-deposited copper foil on both sides was prepared. An etching resist layer (a dry film was used) was provided on each of both copper foil layers of the double-sided CCL. Then etching pattern of the inner layer circuit is exposed followed by developing, etching, releasing of the etching resist, cleaning and drying to get an inner layer circuit board IB as shown in FIG. 3(2).

Then, "the first inner layer circuit board" to "the tenth inner layer circuit board" which were the same as those in EXAMPLE 1 were prepared. The process conditions and the like are the same as in EXAMPLE 1, so the description thereof will be omitted here to avoid its repetition.

(Coating of the Inner Layer Circuit Boards with a Varnish)

As a raw material, a solvent-soluble aromatic polyamide resin polymer (BP3225-50P: manufactured by Nippon Kayaku Co., Ltd. commercially available as a mixed varnish in cyclopentanone) and an o-cresol novolac epoxy resin (YDCN-704, manufactured by Tohto Kasei Co., Ltd.) were used. In addition, a curing agent (VH-4170, phenolic resin manufactured by Dainippon Ink and Chemicals Inc.), and a curing accelerator (2E4MZ, manufactured by Shikoku Corp.) were added to prepare a varnish having the blending ratios as same as in EXAMPLE 1. So, the description thereof is omitted here. For the purpose of obtaining a varnish for coating, methyl ethyl ketone was added to the resin mixture to get a varnish to have a solid content of 12 wt %.

The above described inner layer circuit boards were dipped in the varnish prepared as described above, as the image shown in FIG. 4(A), and then taken out to form a varnish coating on both surfaces of the inner layer circuit boards. Then, dried for 5 minutes in the air, and then heated at 140 deg. C. for 5 minutes to form a 1.3 micron m thick primer resin layer in a B-stage on the surfaces of the inner layer circuit boards.

The varnish obtained in this case was for use in coating and very easy to flow, so a special method was applied for resin flow measurement. To prepare sample for the resin flow measurement, coating of the varnish onto one surface of a copper foil followed by curing was repeated until the thickness of the formed resin film reached 40 micron m. Additionally, from this resin flow measurement sample, four 10 cm square samples were cut, and the resin flow measurement was carried out in conformity with above described MIL-P-13949G specification. Consequently, the resin flow was 1.2%.

(Preparation of a Multi-Layered CCL)

In this EXAMPLE, according to the procedures shown in FIG. 8, the multi-layered CCL M2 was prepared. So, a resin coated copper foil 7 as used in EXAMPLE 2 on the primer resin sheets 17 on both surfaces of the inner layer circuit board IB. Then, by hot pressing, the multi-layered CCL M2 having a schematic sectional view shown in FIG. 8(2) was obtained. In this case, the pressing conditions were such that temperature 180 deg. C., pressure 20 kg/sq. -cm with curing time 90 minutes.

(Preparation of a MLB)

Next, an etching resist layer (a dry film was used) was provided on the surface of the metal foil 6 (an outer layer copper foil) on both surfaces of the multi-layered CCL M2, the etching pattern of the outer layer circuit was exposed followed by development, circuit etching, releasing of the etching resist, cleaning and drying to get a MLB 1 like shown in FIG. 1. The state of the inner layer circuit of this board is similar with an optical microscopic photograph which is shown in FIG. 2, the thin primer resin layer P is clearly observed to evenly coat the periphery of the inner layer circuit Ci.

(Performance Evaluation of the MLB)

The MLB 1 obtained as described above were subjected to the thermal shock test and the peel strength measurement in the same manner as in EXAMPLE 1, and the results obtained are shown in Table 5 with Comparative Examples. In Table 5, Samples 5-1 to 5-10 represent a MLB prepared by using the first to tenth inner layer circuit boards.

Figure 17:
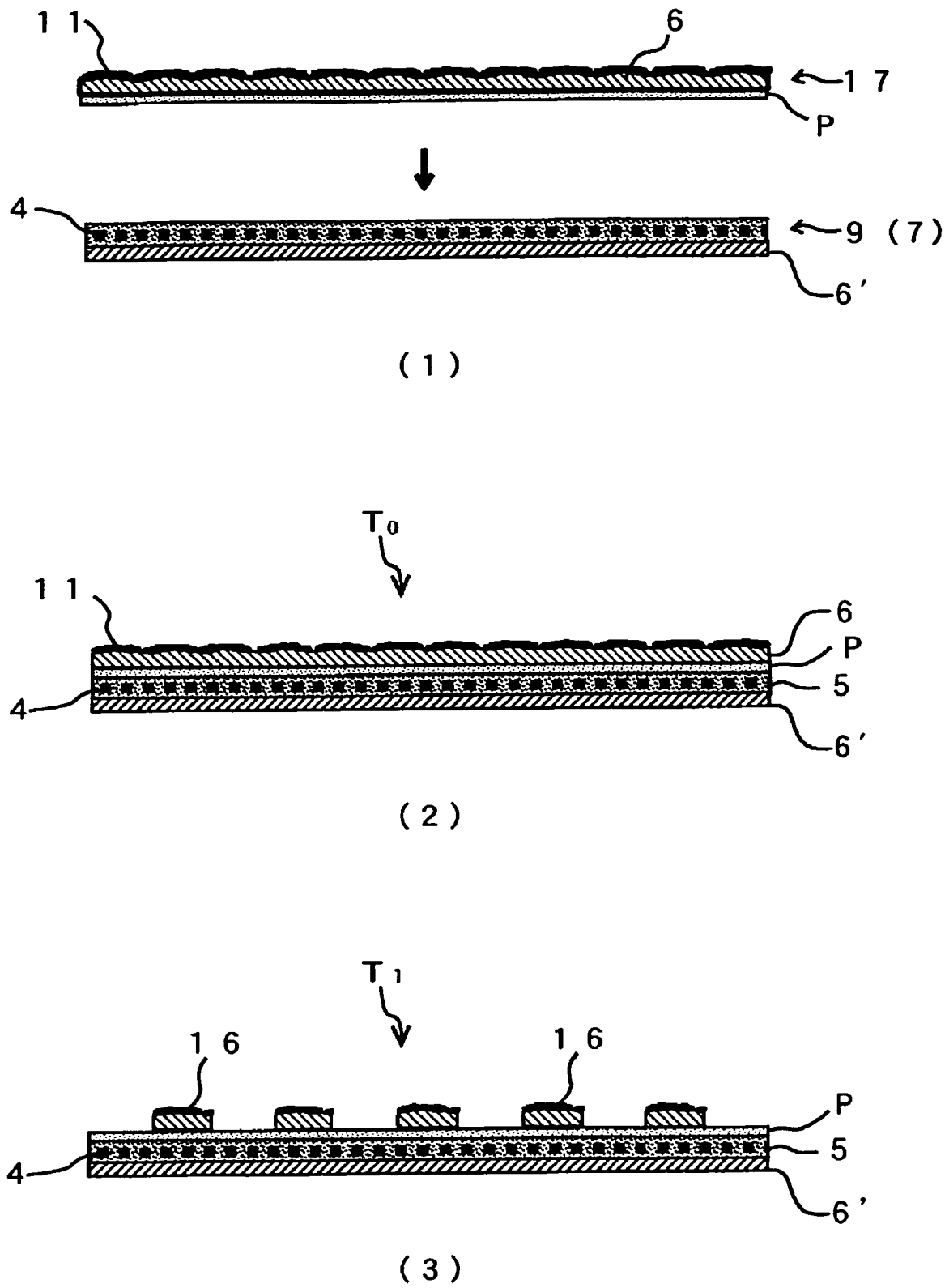
FIG. 17 is schematic views it shows the procedures for preparing a specimen to be used in a peel strength measurement.

Because measurement of the peel strength of the inner layer circuits Ci directly is difficult, the following alternative method was adopted to monitor peel strength of the inner layer circuits Ci. More specifically, to prepare resin coated copper foil samples shown in FIG. 17(1) for measurement, about 1.3 micron m thick primer resin layer P was formed on shiny side of electro-deposited copper foil 6, same lot used for preparing inner layer circuit boards. To prepare a CCL TO shown in FIG. 17(2), A 50 micron m thick pre-preg was superposed on a copper foil 6' as shown in FIG. 17(1) and the resin coated copper foil to be tested 17 was superposed on the pre-preg 5 so that primer resin layer P of the resin coated copper foil to be tested 17 abuts on the pre-preg 5, and then the book was hot-pressed. Then, to prepare a sample T1 for peel strength measurement shown in FIG. 17(3), an etching resist layer (a dry film was used) was provided on the roughened surface 11 of the electro-deposited copper foil 6, etching patterns of 0.2 mm wide straight line circuits 16 for peel strength measurement were exposed followed by development, circuit etching, releasing of the etching resist, cleaning and drying.

The results on the thermal shock test and the peel strength measurement are shown in Table 5 with Comparative Examples. In Table 5, Samples 5-1 to 5-10 represent a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 5

| Example | No. | Inner layer circuit board | | Thermal shock test | Peel strength kgf/cm |
|---|---|---|---|---|---|
| | | Silane layer | Surface treatment | | |
| Example | 1 | None | None | Pass | 0.90 |
| | 2 | Formed | | | 1.13 |
| | 3 | None | Sn | | 1.21 |
| | 4 | | Ni | | 1.22 |
| | 5 | | Sn—Pb | | 1.30 |
| | 6 | | Ni—Zn | | 1.28 |
| | 7 | Formed | Sn | | 1.38 |
| | 8 | Formed | Ni | | 1.39 |
| | 9 | Formed | Sn—Pb | | 1.42 |
| | 10 | Formed | Ni—Zn | | 1.40 |
| Comp. Example | 1 | None | None | N.G. | 0.21 |
| | 2 | | | | 0.10 |
| | 3 | | | | 0.14 |
| | 4 | Formed | | | 0.32 |

EXAMPLE 6

In this EXAMPLE, a primer resin layer was formed by coating on the surface of an inner layer circuit board, then a multi-layered CCL was prepared by use of the inner layer circuit boards, and a MLB was prepared by use of the multi-layered CCL.

(Preparation of Inner Layer Circuit Boards)

In the same manner as in EXAMPLE 1, a 100 micron m thick FR-4 double-sided CCL with 18 micron m thick electro-deposited copper foil on both sides was prepared. An etching resist layer (a dry film was used) was provided on each of both copper foil layers of the double-sided CCL. Then etching pattern of the inner layer circuit is exposed followed by developing, etching, releasing of the etching resist, cleaning and drying to get an inner layer circuit board IB as shown in FIG. 3(2).

Then, "the first inner layer circuit board" to "the tenth inner layer circuit board" which were the same as those in EXAMPLE 1 were prepared. The process conditions and the like are the same as in EXAMPLE 1, so the description thereof will be omitted here to avoid its repetition.

(Coating of the Inner-Layer Circuit Boards with a Varnish)

As a raw material, a solvent-soluble aromatic polyamide resin polymer (BP3225-50P: manufactured by Nippon Kayaku Co., Ltd. commercially available as mixed varnish in cyclopentanone) and an o-cresol novolac epoxy resin (YDCN-704, manufactured by Tohto Kasei Co., Ltd.) were used. In addition, a curing agent (VH-4170, phenolic resin manufactured by Dainippon Ink and Chemicals Inc.), and a curing accelerator (2E4MZ, manufactured by Shikoku Corp.) were added to prepare a varnish having the blending ratios as same as in EXAMPLE 1. So, the description thereof is omitted here. For the purpose of obtaining a varnish for coating, methyl ethyl ketone was added to the resin mixture to get a varnish to have a solid content of 12 wt %.

The above described inner layer circuit boards were dipped in the varnish prepared as described above, as the image shown in FIG. 4(A), and then taken out to form a varnish coating on both surfaces of the inner layer circuit boards. Then, dried for 5 minutes in the air, and then heated at 140 deg. C. for 5 minutes to form a 1.3 micron m thick primer resin layer in a B-stage on the surfaces of the inner layer circuit boards.

The varnish obtained in this case was for use in coating and very easy to flow, so a special method was applied for resin flow measurement. To prepare sample for the resin flow measurement, coating of the varnish onto one surface of a copper foil followed by curing was repeated until the thickness of the formed resin film reached 40 micron m. Additionally, from this resin flow measurement sample, four 10 cm square samples were cut, and the resin flow measurement was carried out in conformity with above described MIL-P-13949G specification. Consequently, the resin flow was 1.2%.

(Preparation of a Multi-Layered CCL)

In this EXAMPLE, according to the procedures shown in FIG. 10, the multi-layered CCL M3 was prepared. So, a skeletal material reinforced resin coated copper foil 9 which was the same-as in EXAMPLE 3 was used; and the resin surface of the skeletal material reinforced resin coated copper foil 9 was superposed on each of the primer resin layer P situated on both surfaces of the inner layer circuit board IB, as shown in FIG. 10(1). Then, by hot pressing, the multi-layered CCL M3 having a schematic sectional view shown in FIG. 10(2) was obtained. In this case, the pressing condition was temperature 180 deg. C., pressure 20 kg/sq.-cm with curing time 90 minutes.

(Preparation of a MLB)

Next, an etching resist layer (a dry film was used) was provided on the surface of the metal foil 6 (an outer layer copper foil) on both surfaces of the multi-layered CCL M3. Then, the etching pattern of the outer layer circuit was exposed followed by development, circuit etching, releasing of the etching resist, cleaning and drying to get a MLB 1 like shown in FIG. 1. The state of the inner layer circuit of this board is similar with an optical microscopic photograph which is shown in FIG. 2, the thin primer resin layer P is clearly observed to evenly coat the periphery of the inner layer circuit ci.

(Performance Evaluation of the MLB)

The MLB 1 obtained as described above were subjected to the thermal shock test and the peel strength measurement in the same manner as in EXAMPLE 1, and the results obtained are shown in Table 6 with Comparative Examples. In Table 6, Samples 6-1 to 6-10 represent a MLB prepared by using the first to tenth inner layer circuit boards.

Because measurement of the peel strength of the inner layer circuits Ci directly is difficult, the following alternative method was adopted to monitor peel strength of the inner layer circuits Ci. More specifically, to prepare resin coated copper foil samples shown in FIG. 17(1) for measurement, about 1.3 micron m thick primer resin layer P was formed on shiny side of electro-deposited copper foil 6, same lot used for preparing inner layer circuit boards. To prepare a CCL TO shown in FIG. 17(2), A 50 micron m thick pre-preg was superposed on a copper foil 6' as shown in FIG. 16(1) and the resin coated copper foil to be tested 17 was superposed on the pre-preg 5 so that primer resin layer P of the resin coated copper foil to be tested 17 abuts on the pre-preg 5, and then the book was hot-pressed. Then, to prepare a sample T1 for peel strength measurement shown in FIG. 17(3), an etching resist layer (a dry film was used) was provided on the roughened surface 11 of the electro-deposited copper foil 6, etching patterns of 0.2 mm wide straight line circuits 16 for peel strength measurement were exposed followed by development, circuit etching, releasing of the etching resist, cleaning and drying.

The results on the thermal shock test and the peel strength measurement are shown in Table 6 with Comparative Examples. In Table 6, Samples 6-1 to 6-10 represent a MLB prepared by using the first to tenth inner layer circuit boards, respectively. It is to be noted that in the thermal shock test, "N.G." means blister observation in the inner layer circuit Ci, and "Pass" means no blister observation in the inner layer circuit Ci. The unit for the peel strength is kgf/cm.

TABLE 6

| | | Inner layer circuit board | | | |
|---|---|---|---|---|---|
| Example | No. | Silane layer | Surface treatment | Thermal shock test | Peel strength kgf/cm |
| Example | 1 | None | None | Pass | 0.88 |
| | 2 | Formed | | | 1.06 |
| | 3 | None | Sn | | 1.15 |
| | 4 | | Ni | | 1.18 |
| | 5 | | Sn—Pb | | 1.22 |
| | 6 | | Ni—Zn | | 1.27 |
| | 7 | Formed | Sn | | 1.31 |
| | 8 | Formed | Ni | | 1.32 |
| | 9 | Formed | Sn—Pb | | 1.41 |
| | 10 | Formed | Ni—Zn | | 1.43 |
| Comp. Example | 1 | None | None | N.G. | 0.21 |
| | 2 | | | | 0.10 |
| | 3 | | | | 0.14 |
| | 4 | Formed | | | 0.32 |

COMPARATIVE EXAMPLE 1

In this COMPARATIVE EXAMPLE, a MLB without primer resin layer was prepared by omitting the primer resin layer under the conditions using the first inner layer circuit board of EXAMPLE 1. So, all the steps involved lead to its repetitions, so descriptions on the steps will be omitted here and only the performance evaluation of the MLB will be described.

(Performance Evaluation of the MLB)

Figure 19:
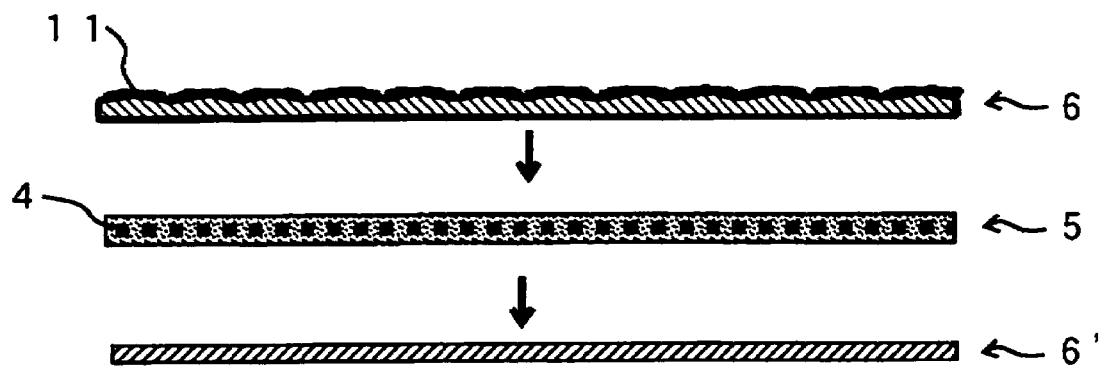
FIG. 19 is schematic views it shows the procedures for preparing a specimen to be used in a peel strength measurement.
Figure 19:
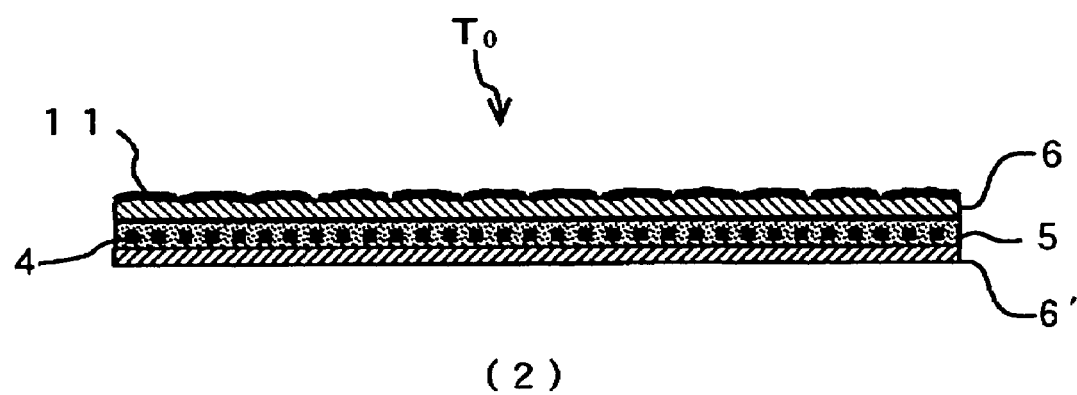
Figure 19:
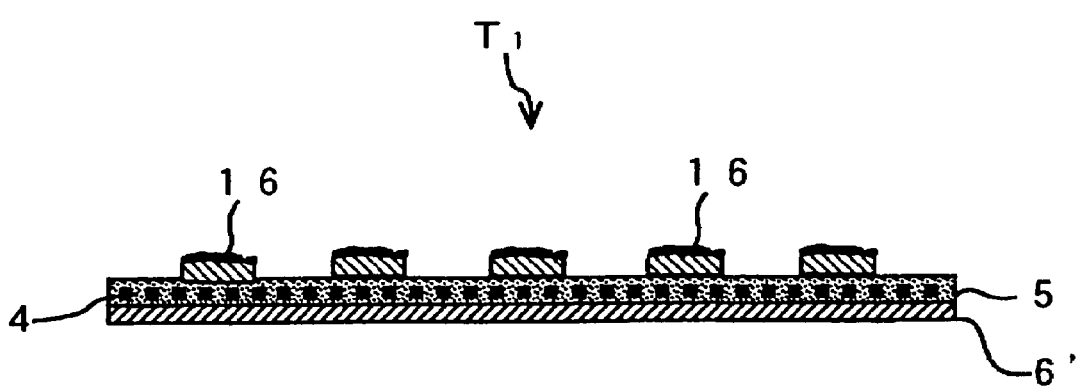

The MLB obtained as described above was subjected to the same thermal shock test as in EXAMPLE 1, and visual inspection was carried out. Consequently, some whitened portions of the inner layer circuits which indicates occurrence of insufficient adhesion were found over fairly large areas of the inner layer circuits Ci. Additionally, because direct measurement of the peel strength of each of the inner layer circuits Ci was difficult, a sample T1 for peel strength measurement shown in FIG. 19(3) was prepared by use of an electro-deposited copper foil 6 obtained from the same lot used in forming the inner layer circuit on the basis of a method which omitted a primer resin layer 3 as shown in FIG. 19 and adopted similar procedure shown in FIG. 14. The peel strength for this case was measured, and it was 0.21 kgf/cm. This result is listed in the tables shown in above described EXAMPLES.

COMPARATIVE EXAMPLE 2 in this COMPARATIVE EXAMPLE, a MLB without primer resin layer was prepared by omitting the primer resin layer under the conditions using the first inner layer circuit board in EXAMPLE 2. So, all the steps involved lead to its repetitions, so descriptions on the steps will be omitted here and only the performance evaluation of the MLB will be described.

(Performance Evaluation of the MLB)

Figure 20:
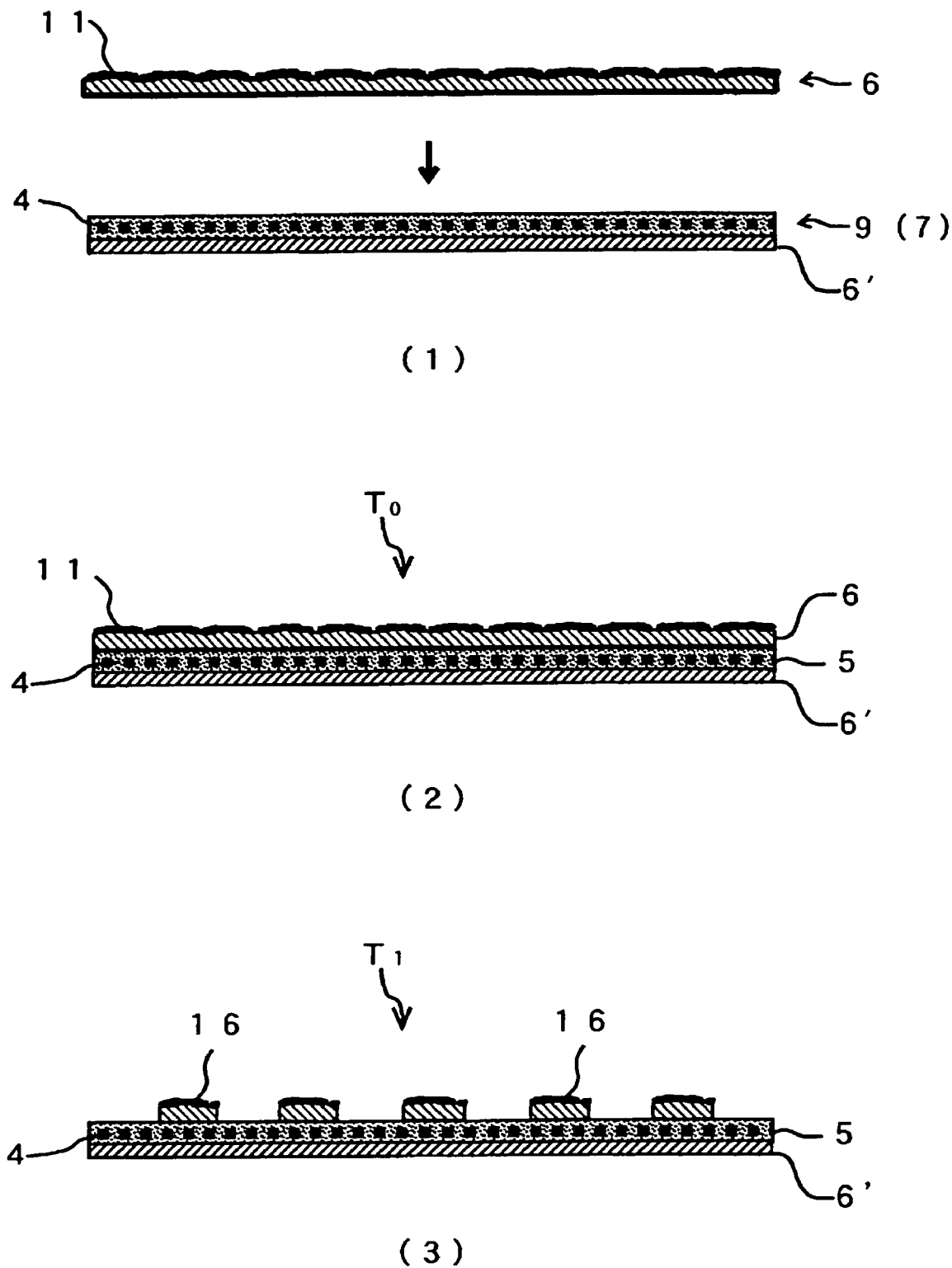
FIG. 20 is schematic views it shows the procedures for preparing a specimen to be used in a peel strength measurement.
Figure 21:
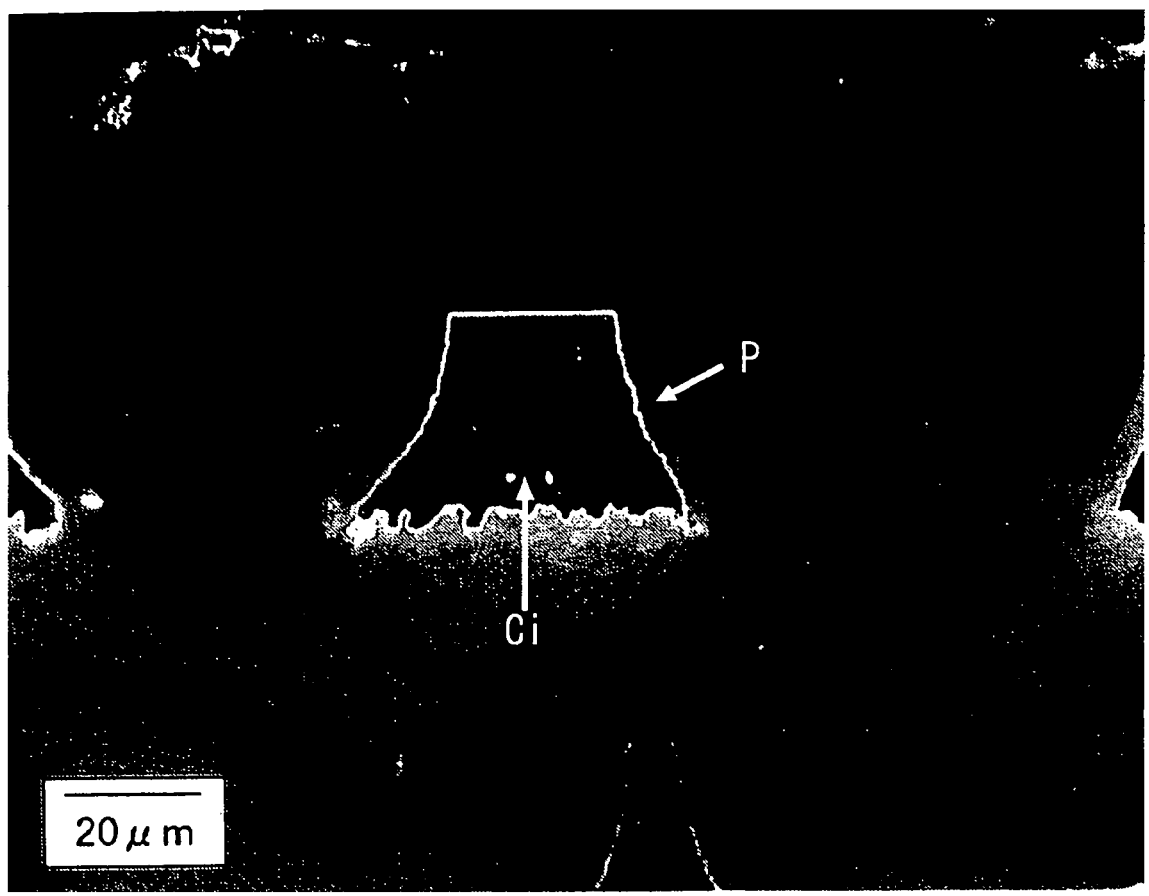
FIG. 21 is an optical microscopic photograph of the cross sectional view it shows an inner layer circuit of the MLB of the present invention.

The MLB obtained as described above was subjected to the same thermal shock test as in EXAMPLE 1, and visual inspection was carried out. Consequently, some whitened portions of the inner layer circuits which indicates occurrence of insufficient adhesion were found over fairly large areas of the inner layer circuits Ci. Additionally, because direct measurement of the peel strength of each of the inner layer circuits Ci was difficult, a sample T1 for peel strength measurement shown in FIG. 20(3) was prepared by use of an electro-deposited copper foil 6 obtained from the same lot used in forming the inner layer circuit on the basis of a method which omitted a primer resin layer 3 as shown in FIG. 20 and adopted similar procedure as shown in FIG. 15. The peel strength for this case was measured, and it was 0.10 kgf/cm. This result is listed in the tables shown in above described EXAMPLES.

COMPARATIVE EXAMPLE 3

In this COMPARATIVE EXAMPLE, a MLB without primer resin layer was prepared by omitting the primer resin layer under the conditions using first inner layer circuit board of EXAMPLE 3. So, all the steps involved lead to its repetitions, so descriptions on the steps will be omitted here and only the performance evaluation of the MLB will be described.

(Performance Evaluation of the MLB)

The MLB obtained as described above was subjected to the same thermal shock test as in EXAMPLE 1, and visual inspection was carried out. Consequently, some whitened portions of the inner layer circuits which indicates occurrence of insufficient adhesion were found over fairly large areas of the inner layer circuits Ci. Additionally, because direct measurement of the peel strength of each of the inner layer circuits Ci was difficult, a sample T1 for peel strength measurement was prepared in the same manner as in COMPARATIVE EXAMPLE 2. The peel strength for this case was measured in the same manner as in EXAMPLE 1. Consequently, the peel strength was 0.14 kgf/cm. This result is listed in the tables shown in above described EXAMPLES.

COMPARATIVE EXAMPLE 4

In this COMPARATIVE EXAMPLE, a MLB without primer resin layer was prepared by forming only the silane coupling agent layer on the surface of the first inner layer circuit and by omitting the primer resin layer under the conditions using first inner layer circuit board of EXAMPLE 1. So, all the steps involved lead to its repetitions, so descriptions on the steps will be omitted here and only the performance evaluation of the MLB will be described.

(Performance Evaluation of the MLB)

The MLB obtained as described above was subjected to the same thermal shock test as in EXAMPLE 1, and visual inspection was carried out. Consequently, some whitened portions of the inner layer circuits which indicates occurrence of insufficient adhesion were found over fairly large areas of the inner layer circuits Ci. Additionally, because direct measurement of the peel strength of each of the inner layer circuit Ci was difficult, the same sample T1 for peel strength measurement as shown in FIG. 20(3) was prepared in the same manner as shown in FIG. 20, by use of an electro-deposited cooper foil 6 obtained from the same lot used in forming the inner layer circuit and subjected to a silane coupling agent treatment. The peel strength for this case was measured, and it was found to be 0.32 kgf/cm.

INDUSTRIAL APPLICABILITY

The multi-layered board of the present invention has a structure including a primer resin layer, a thin resin layer, on the surfaces thereof even when the surfaces of the inner layer circuit are not roughened. The adoption of this structure makes it possible to ensure such a satisfactory adhesion between the inner layer, circuit and the base material resin-that is never found in the printed wiring board industry. The printed wiring board having such a structure makes it possible to omit the roughening treatment of the inner layer circuit such as black oxide treatment and to thereby simplify the manufacturing process thereof, so that a drastic omission of the steps involved in the conventional processes for manufacturing the MLB is made possible, and a drastic reduction of the manufacturing cost is made possible. Moreover, because the roughening treatment for the inner layer circuit comes to be unnecessary, the process for etching the inner layer circuits is permitted to enhance the precision of the circuit etching, and thus the quality of the MLB can be improved from an overall viewpoint.

The invention claimed is:

1. A multi-layered printed wiring board with an inner layer circuit comprising:
a primer resin layer, constituted exclusively of a resin, is provided between said inner layer circuit without roughening treatment and an insulating resin layer, with a surface of the inner layer circuit facing the primer resin layer; a plating of tin, nickel or an alloy of these metals is formed on the surface of the inner layer circuit facing the primer resin layer and a silane coupling agent is provided between said primer resin layer and said plating of tin, nickel or an alloy of these metals.

2. The multi-layered printed wiring board according to claim 1, in which said silane coupling agent is selected from an amino-functional silane coupling agent and/or a mercapto-functional silane coupling agent.

3. The multi-layered printed wiring board according to claim 1, in which the cross sectional thickness of said primer resin layer is 1 μm to 10 μm.

4. The multi-layered printed wiring board according to claim 1, in which said primer resin layer is formed of a resin mixture comprising 20 to 80 parts by weight of an epoxy resin, 20 to 80 parts by weight of a solvent-soluble aromatic polyamide resin polymer and a curing accelerator added in an appropriate amount according to need.

5. The multi-layered printed wiring board according to claim 4, in which the aromatic polyamide resin polymer used for said primer resin layer is reaction product between an aromatic polyamide and a rubbery resin.

6. The multi-layered printed wiring board according to claim 1, in which said primer resin layer is formed of a resin mixture comprising 5 to 50 parts by weight of an epoxy resin (inclusive of a curing agent), 50 to 95 parts by weight of a poly-ethersulfone resin (having a hydroxy-functional or amino-functional at a terminal thereof, and soluble in a solvent), and a curing accelerator added in an appropriate amount according to need.

7. The multi-layered printed wiring board according to claim 1, in which the surface roughness of said surface of the inner layer circuit facing the primer resin layer is not greater than 2 μm.

* * * * *